US011226772B1

(12) United States Patent
Lien et al.

(10) Patent No.: US 11,226,772 B1
(45) Date of Patent: Jan. 18, 2022

(54) PEAK POWER REDUCTION MANAGEMENT IN NON-VOLATILE STORAGE BY DELAYING START TIMES OPERATIONS

(71) Applicant: SanDisk Technologies LLC, Addison, TX (US)

(72) Inventors: Yu-Chung Lien, San Jose, CA (US); Mark Murin, Kfar Saba (IL); Hua-Ling Cynthia Hsu, Fremont, CA (US); Tomer Eliash, Sunnyvale, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 21 days.

(21) Appl. No.: 16/912,381

(22) Filed: Jun. 25, 2020

(51) Int. Cl.
| G06F 3/06 | (2006.01) |
| G11C 16/10 | (2006.01) |
| G11C 16/32 | (2006.01) |
| H01L 25/065 | (2006.01) |
| G11C 16/04 | (2006.01) |

(52) U.S. Cl.
CPC ............ G06F 3/0659 (2013.01); G06F 3/061 (2013.01); G06F 3/0679 (2013.01); G11C 16/10 (2013.01); G11C 16/32 (2013.01); H01L 25/0657 (2013.01); *G11C 16/0483* (2013.01)

(58) Field of Classification Search
CPC ....... G06F 3/061; G06F 3/0679; G11C 16/10; G11C 16/32; H01L 25/0657
See application file for complete search history.

(56) References Cited

U.S. PATENT DOCUMENTS

| 7,701,764 | B2 | 4/2010 | Nguyen | |
| 8,391,077 | B2 * | 3/2013 | Tanaka | G11C 16/32 |
| | | | | 365/185.25 |
| 8,429,436 | B2 | 4/2013 | Fillingim et al. | |
| 8,694,719 | B2 | 4/2014 | Lassa et al. | |
| 9,329,986 | B2 | 5/2016 | Li et al. | |
| 9,443,600 | B2 | 9/2016 | Ghalam et al. | |
| 10,013,345 | B2 | 7/2018 | Erez et al. | |
| 10,095,412 | B2 * | 10/2018 | Hsu | G06F 3/0653 |
| 10,461,750 | B2 * | 10/2019 | Hirashima | H03K 19/017509 |

(Continued)

*Primary Examiner* — Tammara R Peyton
(74) *Attorney, Agent, or Firm* — Vierra Magen Marcus LLP

(57) ABSTRACT

Power and/or current regulation in non-volatile memory systems is disclosed. Peak power/current usage may be reduced by staggering concurrent program operations in the different semiconductor dies. Each set of one or more semiconductor dies has an earliest permitted start time for its program operation, as well as a number of permitted backup start times. The permitted start times are unique for each set of one or more semiconductor dies. There may be a uniform gap or delay between each permitted start time. If a semiconductor die is busy with another memory operation at or after its earliest permitted start time, then the program operation is initiated or resumed at one of the permitted backup times. By having permitted backup times, the memory system need not poll each semiconductor die to determine whether the semiconductor die is ready/busy in order to determine when a die should start a program operation.

20 Claims, 17 Drawing Sheets

(56) References Cited

U.S. PATENT DOCUMENTS

| | | |
|---|---|---|
| 10,559,365 B2 * | 2/2020 | Yang ................. G11C 16/30 |
| 2014/0112079 A1 | 4/2014 | Wakrat et al. |
| 2015/0098272 A1 * | 4/2015 | Kasorla ............. G06F 3/0673 |
| | | 365/185.11 |
| 2017/0256955 A1 | 9/2017 | Addepalli et al. |

* cited by examiner

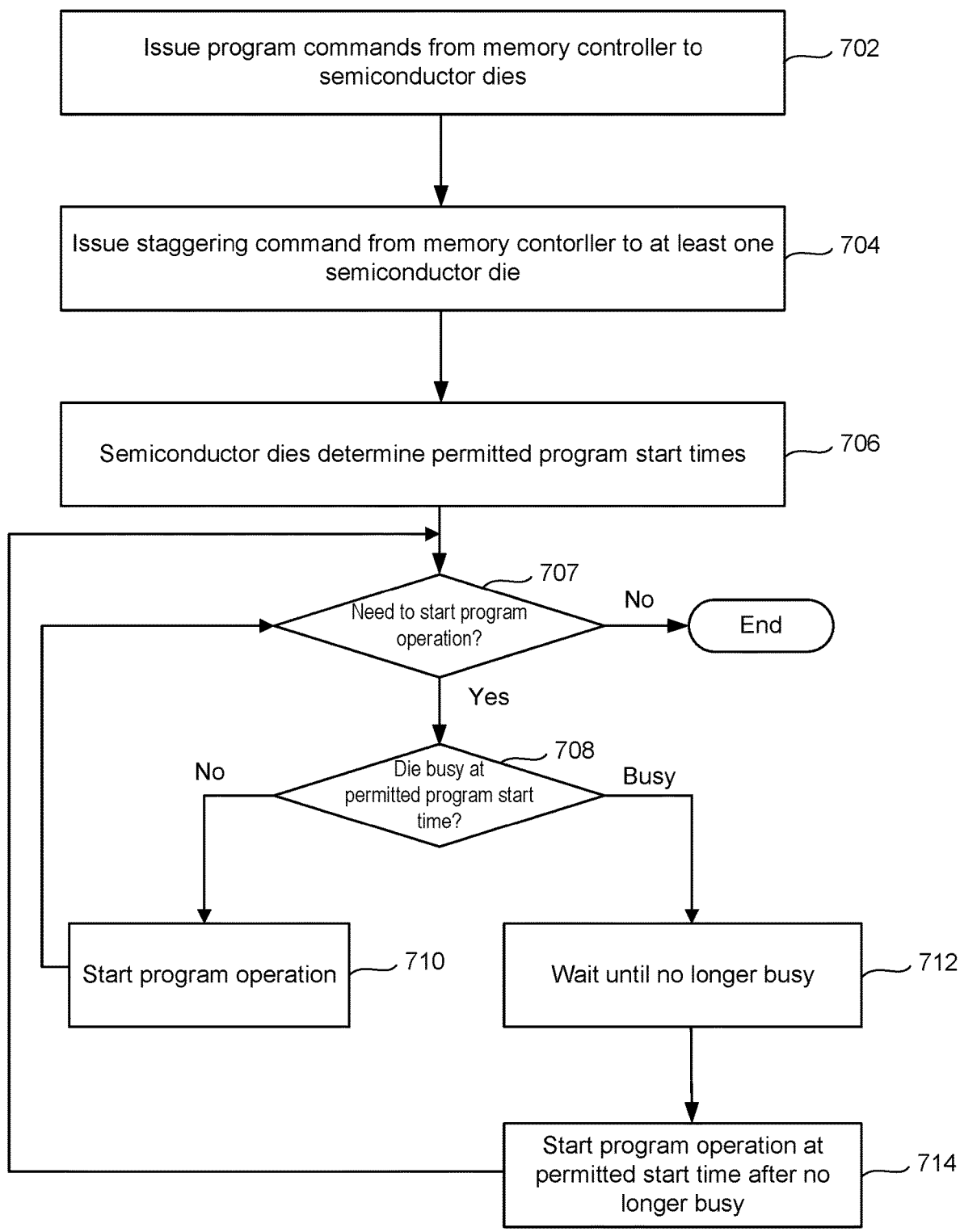

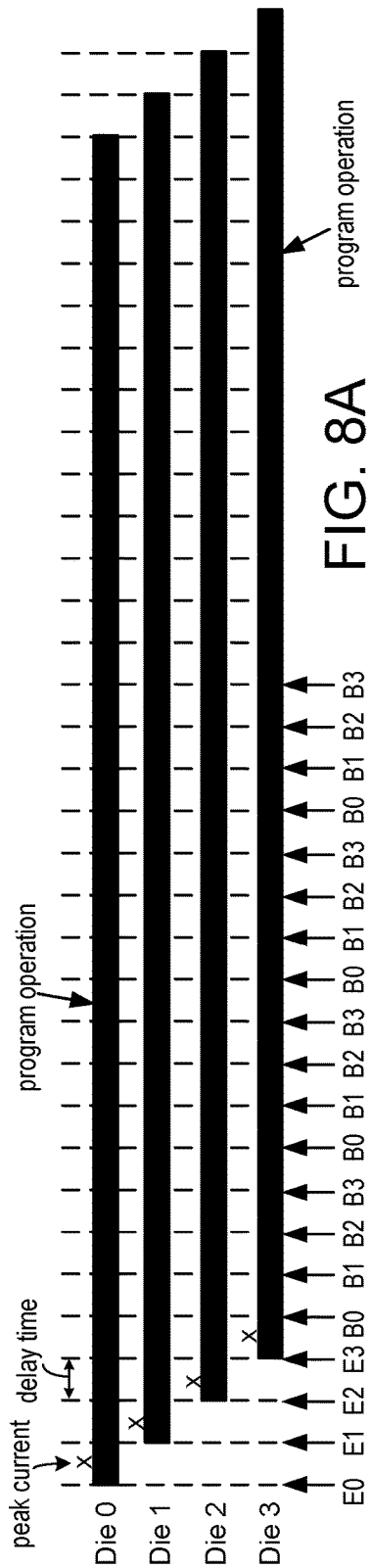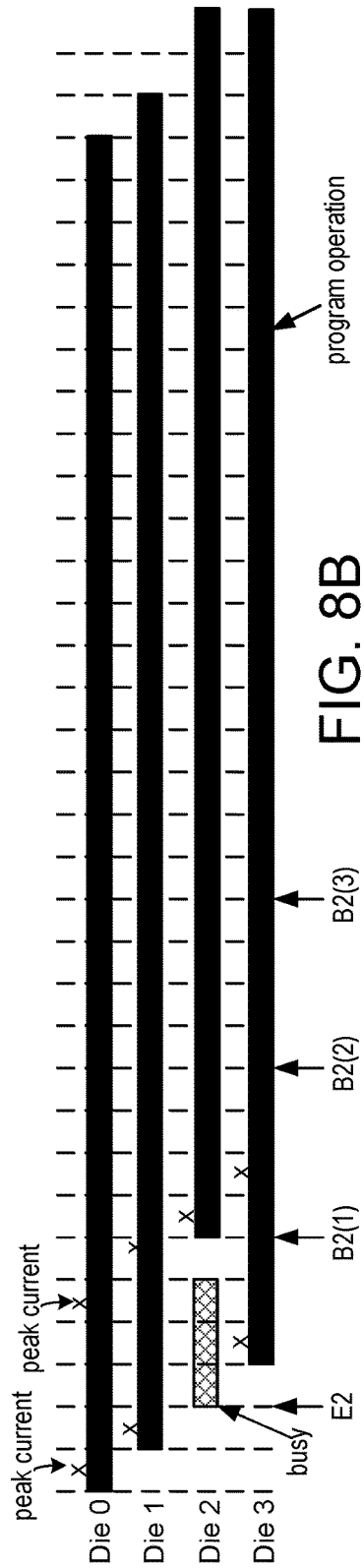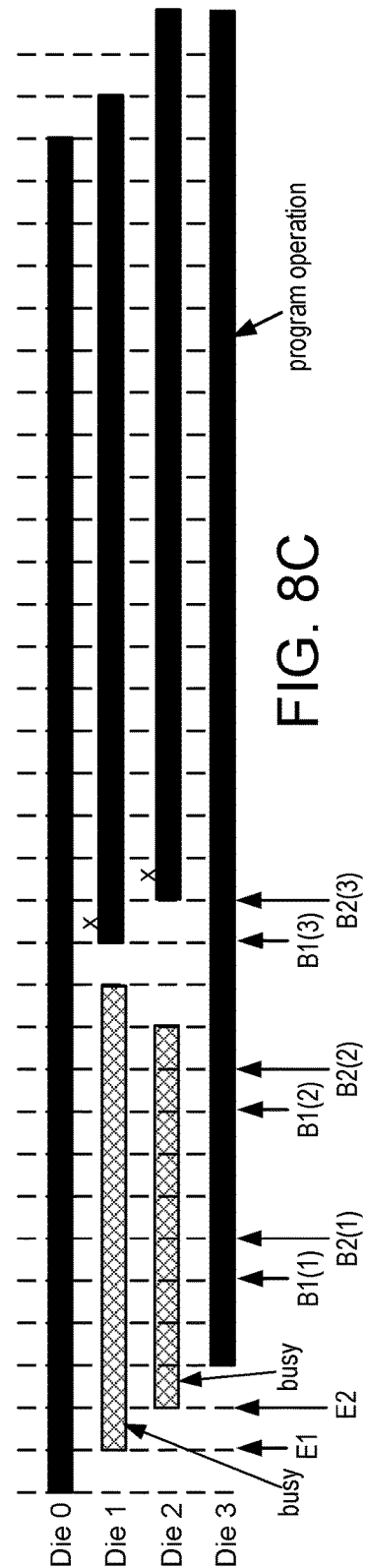

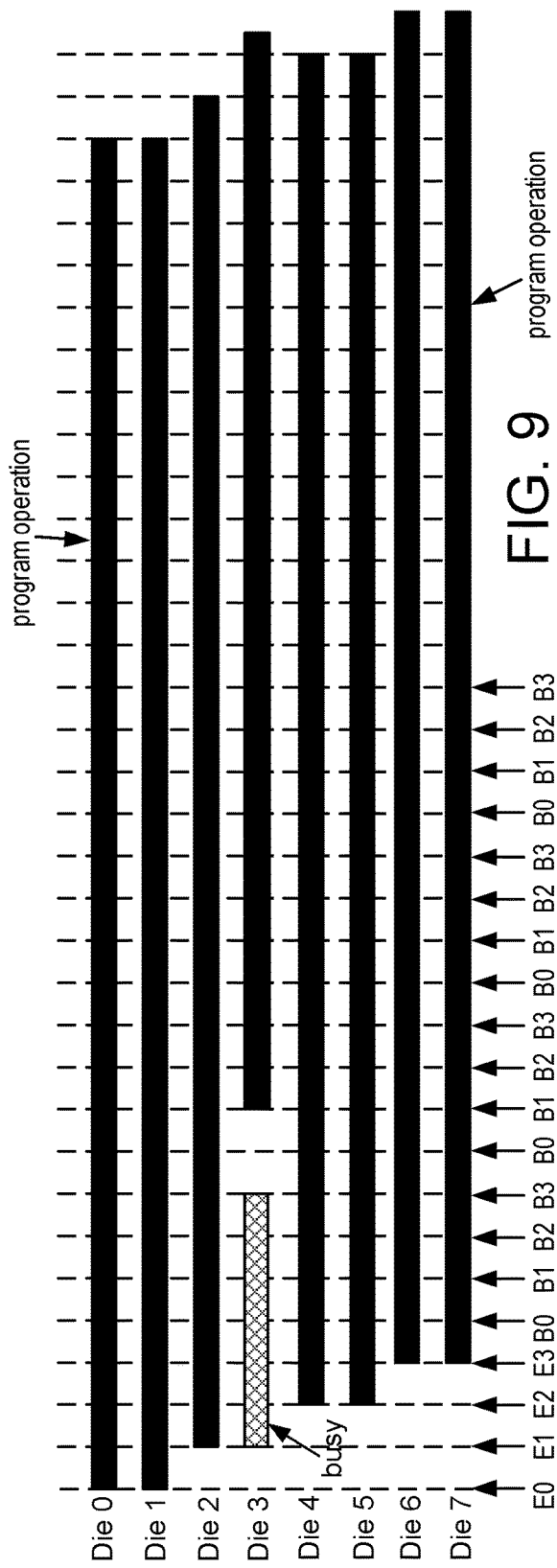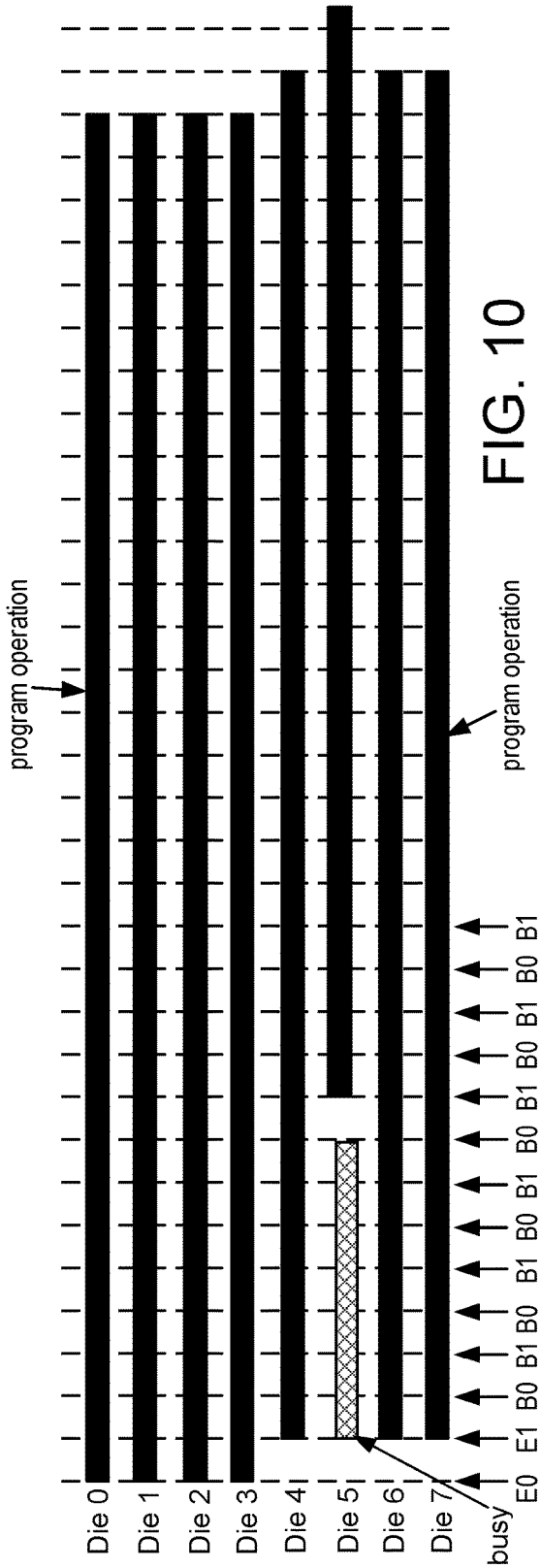

PEAK POWER REDUCTION MANAGEMENT IN NON-VOLATILE STORAGE BY DELAYING START TIMES OPERATIONS

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Non-volatile semiconductor memory systems often contain multiple semiconductor dies ("memory dies") that each contain non-volatile memory cells that may be programmed to store data. It is common to control the memory dies with a memory controller that is separate from the memory dies. The memory controller typically communicates with the memory dies over a data bus using a standard communication protocol. In the case of NAND memory, the Open NAND Flash Interface (ONFI) may be used as the communication protocol. The memory dies may be operated by the memory controller in parallel in order to increase performance of the memory system. However, parallel operation is typically limited by the ability of the hosting device to provide power and/or current to the memory system. For example, there may be limits to peak power and/or average power. There are often limits to the peak current that can be provided from the host device to the memory system. The term "peak Icc" is sometimes used to refer to the peak amount of current that is allowed. If the peak current drawn by the memory system is too high, then the magnitude of the supply voltage may drop, which can result in operation failure in the memory system.

Much of the power and/or current that is used by the memory system is used to perform memory operations such as programming the memory cells on the memory dies. Hence, the regulation of the power and/or current used by the memory dies is important in order to keep the current of the entire memory system within an allowed amount. Thus, it is common to limit the amount of power and/or current that may be drawn by the memory dies.

One possible technique to control current consumption is to have circuitry in the memory die to monitor the current consumption by that particular memory die. If the current consumption of the memory die exceeds a limit, the memory die temporarily suspends memory operations. A drawback of this technique is that a memory die could suspend its memory operations at a time when other memory dies in the memory system are not using much current. Thus, it may not actually be necessary to suspend memory operations in order to keep the total current usage of the memory system within an allowed amount.

One possible technique to control current consumption is to have a memory controller poll the ready/busy status of memory dies, and assign memory operations based on availability of memory dies. However, this technique places burdens on the memory controller. Also, when there are many memory dies, polling the ready/busy status of each memory die can be very inefficient.

DESCRIPTION OF THE DRAWINGS

Like-numbered elements refer to common components in the different Figures.

FIG. 7 is a flowchart of one embodiment of a process of controlling current consumption in non-volatile storage.

FIGS. 8A-8D depict timing of embodiments of staggering concurrently performed program operations.

FIG. 9 depicts timing of staggered program operations, which are concurrently performed by four sets of semiconductor dies.

FIG. 10 depicts timing of staggered program operations, which are concurrently performed by two sets of semiconductor dies.

DETAILED DESCRIPTION

Figure 1A:
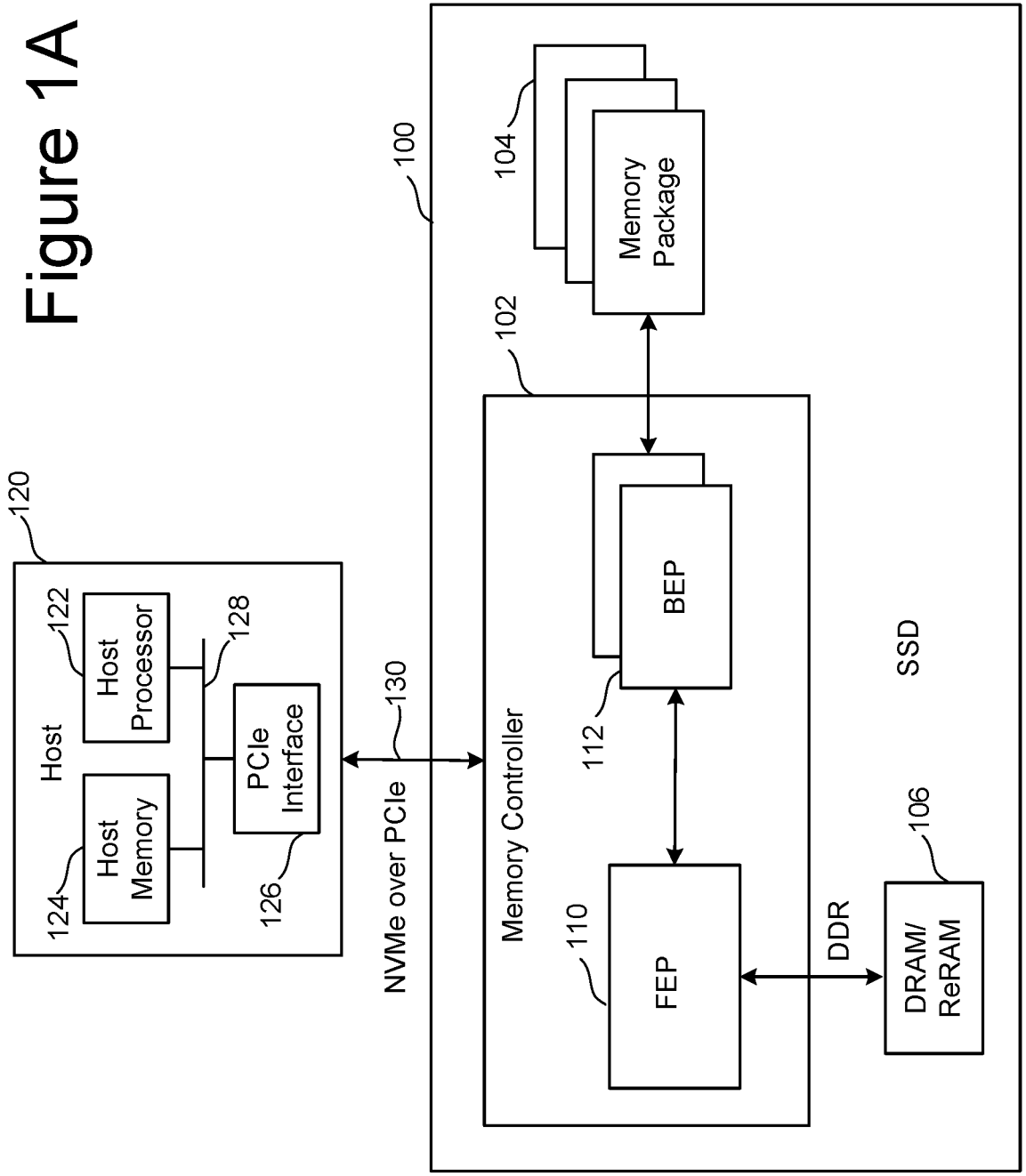
FIG. 1A is a block diagram of one embodiment of a memory system connected to a host.

The present technology will now be described with reference to the figures, which in embodiments, relate to power and/or current regulation in non-volatile memory systems. The memory system has a number of semiconductor dies that contain non-volatile memory cells. Peak power/current usage may be reduced by staggering memory operations, such as program operations, in the different semiconductor dies. In one embodiment, the program operation for each semiconductor die has a different start time. Moreover, these program operation are performed concurrently. Concurrent performance of a program operation means that the program operations overlap in time. However, the concurrent program operations may begin at different times, and may end at different times. Hence, because the program operations occur concurrently, there is the potential that peak current usage could occur at the same time for more than one program operation. However, staggering the program start times reduces or eliminates peak current consumption at the same time.

In some cases, each semiconductor die has an earliest permitted start time for its program operation, as well as a number of permitted backup start times for its program operation. In some embodiments, the permitted backup start times could be used to resume a program operation that may have been initiated at the earliest permitted start time. In one embodiment, the earliest permitted start time and the permitted backup start times are unique for each semiconductor die. However, in some embodiments, the semiconductor dies can be grouped such that each set has an earliest permitted start time, as well as a number of permitted backup start times. Collectively, there are a number of permitted start times for the concurrent program operations. In one embodiment, there is a uniform gap or delay between each permitted start time. For example, there may be an x microsecond gap between each of the earliest permitted start times, as well as an x microsecond gap between each of the permitted backup start times.

In an embodiment, in the event that the semiconductor die is busy with another memory operation at its earliest permitted start time, then the program operation is started at one of the permitted backup times. In one embodiment, the program operation is started at the first permitted backup time at which the semiconductor die is no longer busy with the other memory operation. The permitted backup times for the various semiconductor die are at suitable times such that if one or more semiconductor dies use the permitted backup times that peak current usage does not occur at the same time for multiple semiconductor die. Moreover, by having permitted backup times, the memory system need not poll each semiconductor die to determine whether the semiconductor die is ready/busy. For example, a memory controller can simply send program commands to each semiconductor die with an instruction that the program commands are to be staggered. In one embodiment, each semiconductor die itself determines whether it should start the program operation at the earliest permitted start time or at one of the permitted backup times. Hence, not having to poll the ready/busy status considerably simplifies operation.

In some cases a semiconductor die may start a program operation of a group of non-volatile memory cells, and then temporarily stop the program operation to perform another operation, such as a read command. The semiconductor die starts the program operation again of the group of non-volatile memory cells (also referred to as resuming the program operation) at one of the permitted backup times. Herein, such resumption of the program operation of the group of memory cells considered to be a starting of the program operation, as the program operation was stopped to perform a different memory operation. Herein, the term "initiate" will be used to refer to very beginning of a program operation of a group of non-volatile memory cells. The term initiate will not be used to refer to resuming a program operation of a group of memory cells.

In some embodiments, a memory controller sends a staggering command to the semiconductor dies in order to trigger the staggered program operations. The staggering command may indicate the order of the earliest permitted start time for each semiconductor die. The staggering command may indicate a delay parameter, which is the gap between the permitted start times.

In some embodiments, there is a host semiconductor die and a number of guest semiconductor dies. The host semiconductor die may communicate with the guest semiconductor dies to oversee the staggering of the start times of concurrent program operations. Hence, the memory controller need not oversee the staggering of the start times of concurrent program operations.

In some embodiments, the semiconductor die controls memory operations at a chip level. In some embodiments, the semiconductor die contains the non-volatile memory cells upon which the memory operation is performed, as well as control circuitry that controls the memory operation at the chip level. In some embodiments, the semiconductor die is configured to be connected to the non-volatile memory cells upon which the memory operation is performed. For example, there may be one semiconductor die that contains a memory structure having non-volatile memory cells (referred to herein as a "memory structure die"), and another semiconductor die that contains control circuitry (referred to herein as a "control die") that controls the memory operations on memory structure die. In some embodiments, the control die is bonded to the memory structure die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

FIG. 1A-FIG. 4B describe one example of a memory system that can be used to implement the technology disclosed herein.

FIG. 1A is a block diagram of one embodiment of a memory system 100 connected to a host 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, memory package 104, memory system 100, memory controller 102, or the combination of memory system 100 and host 120.

In one embodiment, there are a plurality of memory package 104. Each memory package 104 may contain one or more memory dies. In one embodiment, each memory die in the memory package 104 utilize NAND flash memory (including two dimensional NAND flash memory and/or three dimensional NAND flash memory). In other embodiments, the memory package 104 can include other types of memory; for example, the memory package can include PCM memory.

Memory controller 102 communicates with host 120 using an interface 130 that implements NVM Express (NVMe) over PCI Express (PCIe). For working with memory system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
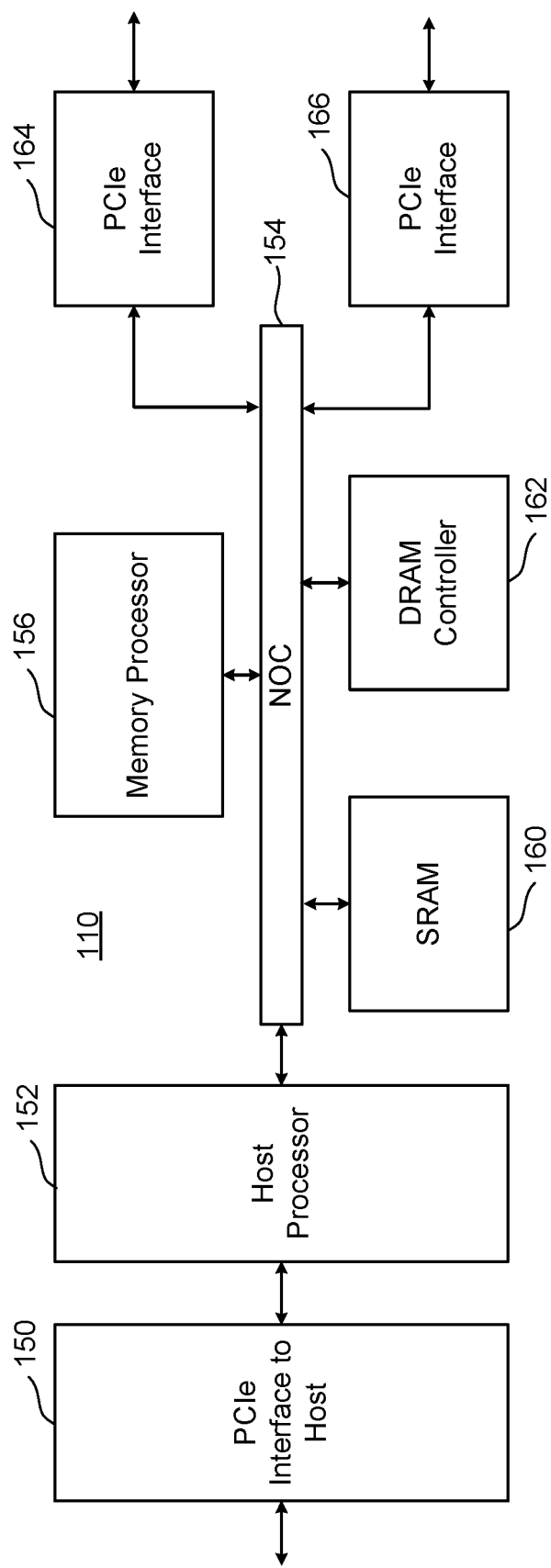
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2A:
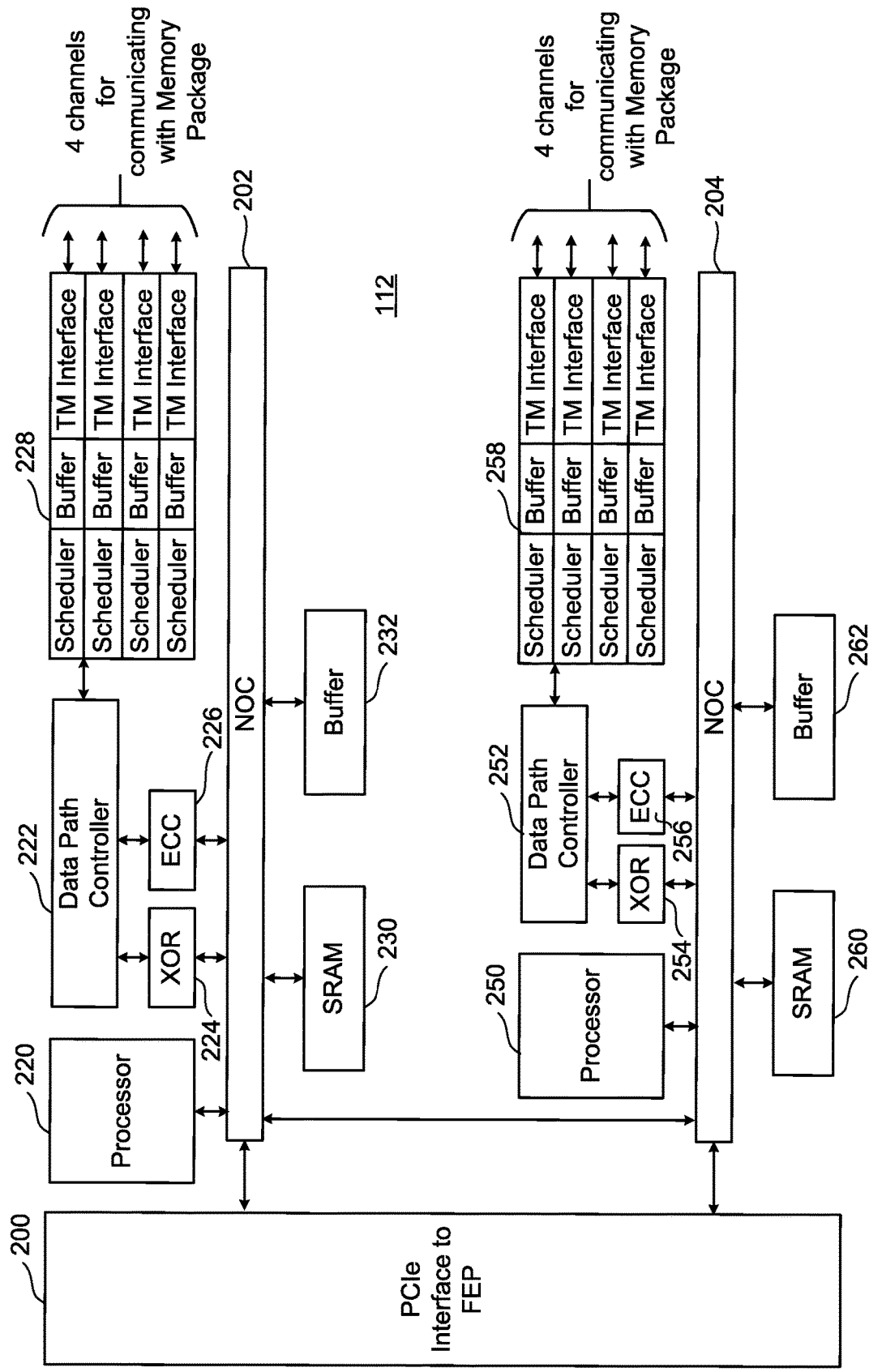
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
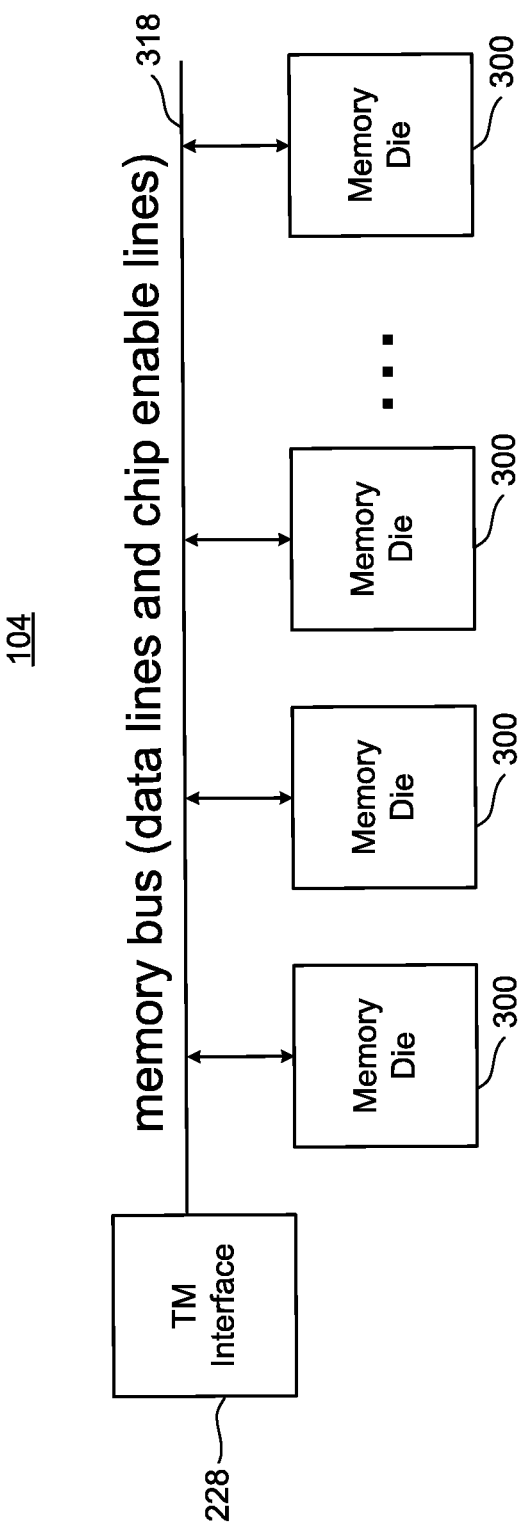
FIG. 2B is a block diagram of one embodiment of a memory package.

FIG. 2B is a block diagram of one embodiment of a memory package 104 that includes a plurality of memory die 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

In some embodiments, the memory die 300 in the package 104 stagger the start of program operations that are concurrently performed in the memory dies 300. Staggering the start of the program operations reduces peak current/power consumption in the package 104. In one embodiment, one of the memory die 300 in the package 104 is a host memory die and the other memory die 300 in the package 104 are guest memory dies. In one embodiment, the host memory die 300 oversees the staggering of the starts of the program operations in the package 104.

Figure 3A:
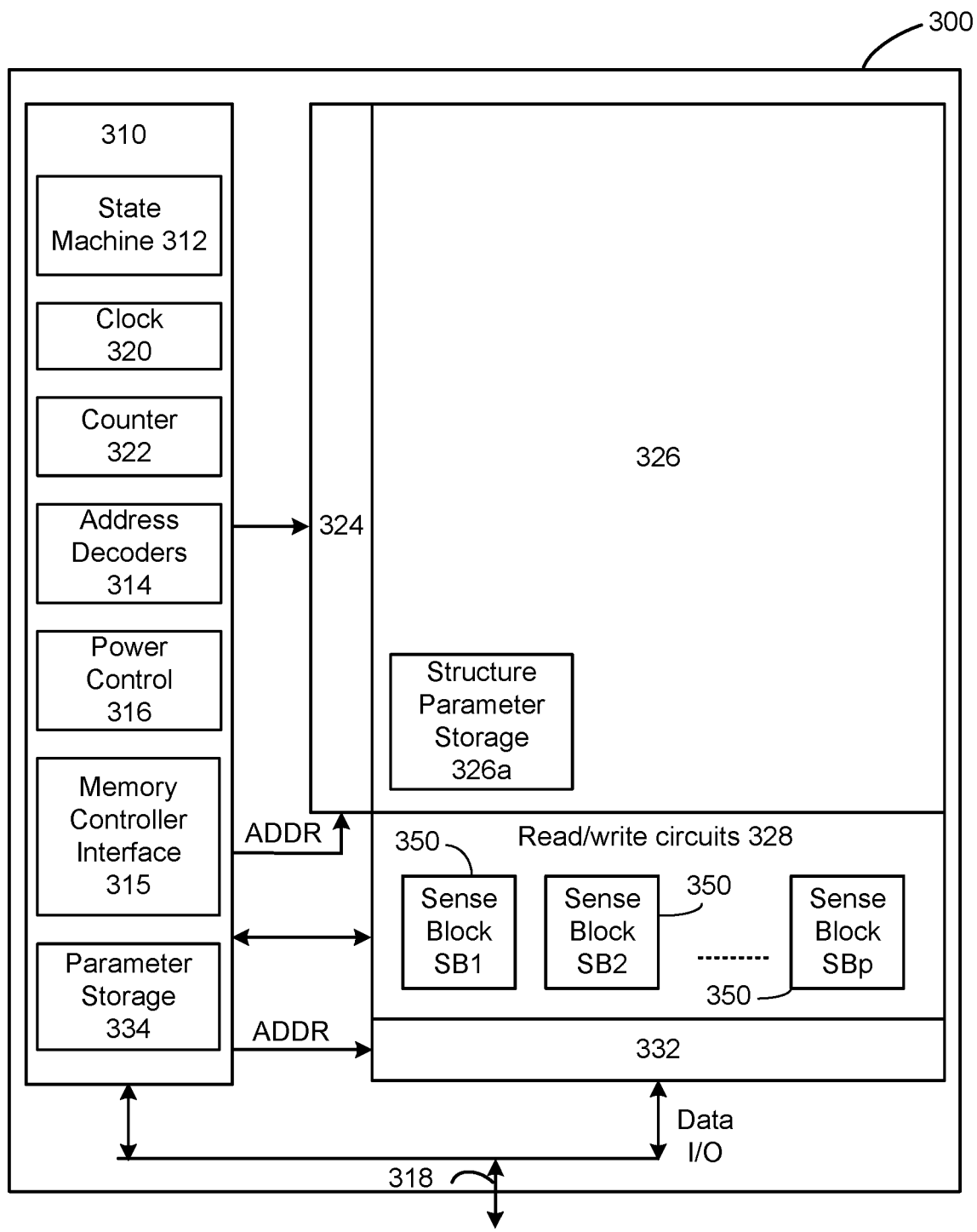
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory controller interface 315. Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 318 (also refers to herein as a data bus). In one embodiment, communication channel 318 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, a clock 320, a counter 322, and parameter storage 334. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326 (e.g., structure parameter storage 326a).

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

The clock 320 may be used to control timing of operations performed by control circuitry 310. For example, the clock 320 may be used by state machine 312 to control timing of applying voltages to the memory structure 326. The clock 320 may be used by state machine 312 to control timing of operations of the read/write circuits 328. The counter 322 may be used to track how much time has passed. In one embodiment, the counter 322 is reset in response to a synchronization event. The synchronization event may be used to synchronize a number of memory dies 300. For example, the memory controller 102 may send a synchronization signal or staggering command, which when received by the control circuitry 310 triggers the reset of the counter 322. The counter 322 is then incremented with each cycle of the clock 320 in order to track how much time has passed since the synchronization event. In one embodiment, the state machine 312 determines when to initiate a program operation in the memory structure 326 based on how much time has passed since the synchronization event. In one embodiment, the memory die 300 has an earliest permitted time to initiate the program operation in the memory structure 326, and a number of permitted backup times to initiate or resume the program operation in the memory structure 326. in one embodiment, the program operation is initiated at the earliest permitted time if the memory die 300 is not busy with another memory operation in the memory structure 326 at the earliest permitted time. However, if the memory die 300 is busy with another memory operation in the memory structure 326 at the earliest permitted time, then the program operation is initiated in the memory structure 326 at one of the permitted backup times. In one embodiment, the program operation is initiated in the memory structure 326 at the first permitted backup time at which the memory die 300 is no longer busy with the other memory operation in the memory structure 326. In one embodiment, the program operation is resumed in the memory structure 326 at the first permitted backup time at which the memory die 300 is no longer busy with the another memory operation in the memory structure 326.

Parameter storage 334 may be used to store parameters for operating the memory structure 326. Parameter storage 334 may include volatile or non-volatile memory. In one embodiment, the parameters include one or more delay parameters. The one or more delay parameters may be used to calculate permitted start times for program operations when program operations are staggered, as described herein. The memory structure 326 has structure parameter storage 326a which may also contain a copy of the parameters for operating the memory structure 326. In some embodiments, the parameters are copied from structure parameter storage 326a to parameter storage 334 when the memory die 300 is powered on.

For purposes of this document, control circuitry 310, alone or in combination with read/write circuits 328 and decoders 324/332, comprise one or more control circuits connected to memory structure 326. This one or more control circuits are an electrical circuit that performs the functions described below in the flow charts. In other embodiments, the one or more control circuits can consist only of controller 102 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 102 and control circuitry 310 performing the functions described below in the flow charts. In another embodiment, the one or more control circuits comprises state machine 312 (and/or a microcontroller and/or microprocessor) alone or in combination with controller 102. In another alternative, the one or more control circuits comprises controller 102, control circuitry 310, read/write circuits 328 and decoders 324/332 performing the functions described below in the flow charts. In other embodiments, the one or more control circuits comprises one or more electrical circuits that operate the non-volatile memory. The term apparatus as used herein may include, but is not limited to, memory die 300, memory package 104, storage device 100, or a host system 120 that includes a storage device 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
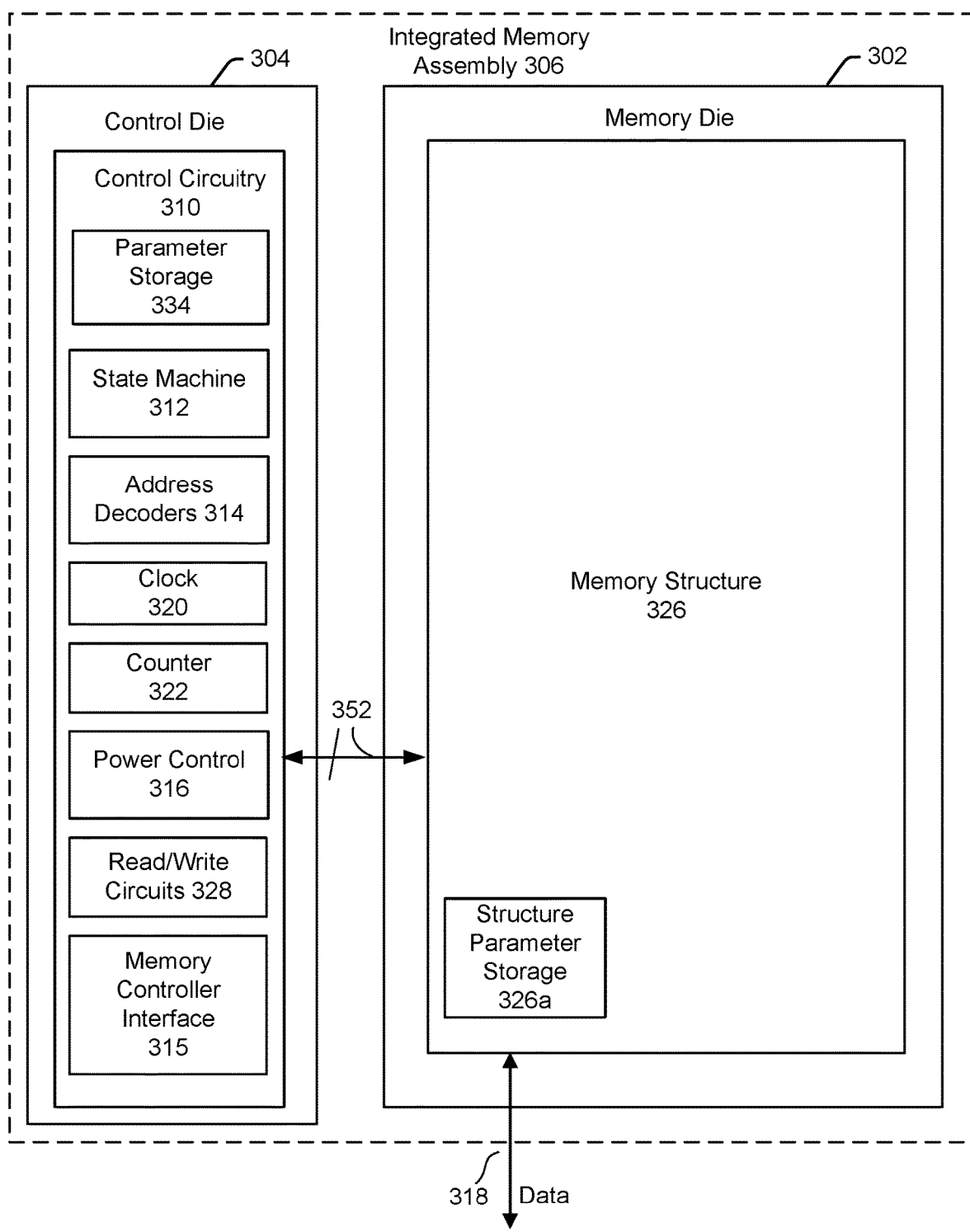
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in memory system 100. In one embodiment, the integrated memory assembly 306 includes two types of semiconductor die (or more succinctly, "die"). Memory structure die 302 includes include memory structure 326. Memory structure 326 may contain non-volatile memory cells. Control die 304 includes control circuitry 310. In some embodiments, the control die 304 is configured to be connected to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, a power control circuit 316, memory controller interface 315, internal clock 320, counter 322, and parameter storage 334. The control circuitry 310 also includes read/write circuits 328. In another embodiment, a portion of the read/write circuits 328 are located on control die 304, and a portion of the read/write circuits 328 are located on memory die 302.

The clock 320 may be used to control timing of operations performed by control circuitry 310. For example, the clock 320 may be used by state machine 312 to determine when to apply voltages to the memory structure 326. The counter 322 may be used to track how much time has passed. In one embodiment, the counter is reset in response to a synchronization event. The synchronization event may be used to synchronize control dies 304. For example, the memory controller 102 may send a synchronization signal or staggering command, which when received by the control circuitry 310 in the control dies 304 triggers the reset of the counter 322. The counter 322 is then incremented with each cycle of the clock 320 in order to track how much time has passed since the synchronization event. In one embodiment, the state machine 312 determines when to initiate a program command based on how much time has passed since the synchronization event. In one embodiment, the control die 304 has an earliest permitted time to initiate the program operation in the memory structure 326, and a number of permitted backup times to initiate or resume the program operation in the memory structure 326. The program operation is initiated at the earliest permitted time if the control die 304 is not busy with another memory operation in the memory structure 326 at the earliest permitted time. However, if the control die 304 is busy with another memory operation in the memory structure 326 at the earliest permitted time, then the program operation is initiated at one of the permitted backup time. In one embodiment, the program operation is initiated at the first permitted backup time at which the control die 304 is not busy with another memory operation in the memory structure 326.

Parameter storage 334 may be used to store parameters for operating the memory structure 326. Parameter storage 334 may include volatile or non-volatile memory. In one embodiment, the parameters include one or more delay parameters. The one or more delay parameters may be used to calculate permitted start times for program operations when program operations are staggered, as described herein. The memory structure 326 has structure parameter storage 326a which may also contain a copy of the parameters for operating the memory structure 326. In some embodiments, the parameters are copied from structure parameter storage 326a to parameter storage 334 when the memory die 300 is powered on.

Any subset of components in the control circuitry 310 of control die 304 can be considered one or more control circuits. In another alternative, the one or more control circuits comprises controller 102 and control circuitry 310 of control die 304 performing the functions described below in the flow charts. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 306 includes a set of input and/or output (I/O) pins that connect to communication channel 318 (also refers to herein as a data bus). Communication channel 318 is depicted as being connected to integrated memory assembly 306 for generality. Communication channel 318 may connect to either or both of die 302 and/or 304. In one embodiment, communication channel 318 connect the memory controller 102 directly to control die 304.

Figure 4A:
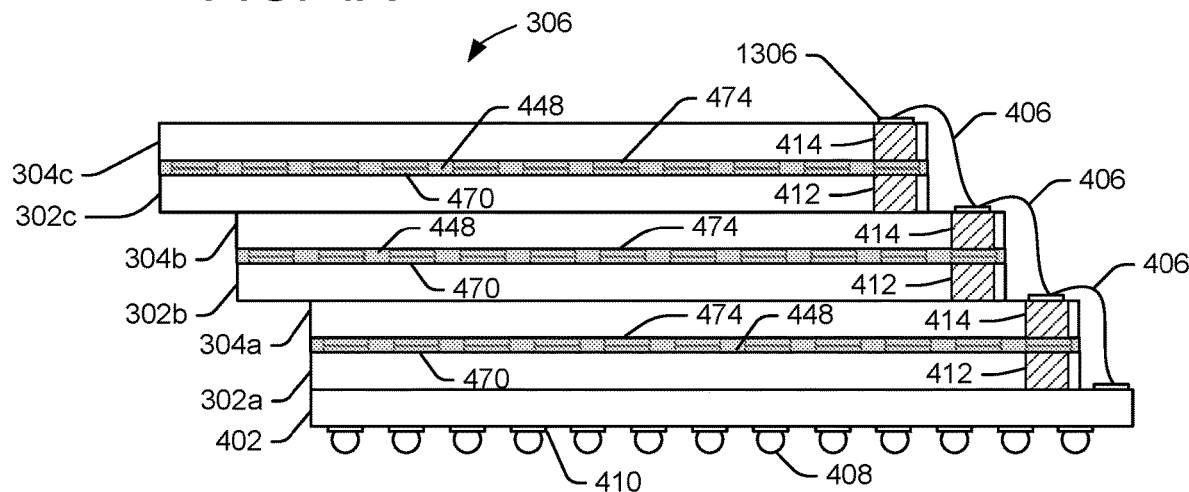
FIG. 4A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 4A depicts a side view of an embodiment of an integrated memory assembly 306 stacked on a substrate 402 (e.g., a stack comprising control dies 304 and memory structure dies 302). The integrated memory assembly 306 has three control die 304a, 304b, 304c and three memory structure die 302a, 302b, 302c. In some embodiments, there are many more than three memory structure die 302 and many more than three control die 304. In one embodiment, one of the control die (e.g., 302a) is a host control die.

Each control die 304 is affixed (e.g., bonded) to at least one of the memory structure die 302. Some of the bond pads 470, 474, are depicted. There may be many more bond pads. A space between two dies 302, 304 that are bonded together is filled with a solid layer 448, which may be formed from epoxy or other resin or polymer. This solid layer 448 protects the electrical connections between the dies 302, 304, and further secures the dies together. Various materials may be used as solid layer 448, but in embodiments, it may be Hysol epoxy resin from Henkel Corp., having offices in California, USA.

The integrated memory assembly 306 may for example be stacked with a stepped offset, leaving the bond pads at each level uncovered and accessible from above. Wire bonds 406 connected to the bond pads connect the control die 304 to the substrate 402. A number of such wire bonds may be formed across the width of each control die 304 (i.e., into the page of FIG. 4A).

A memory structure die through silicon via (TSV) 412 may be used to route signals through a memory structure die 302. A control die through silicon via (TSV) 414 may be used to route signals through a control die 304. In some embodiments, the host control die (e.g., 304a) communicates with guest control die (e.g., 304b, 304c) by a communication link. In some embodiments, at least a portion of the communication link extends through one or more memory die TSV 412 and one or more control die TSV 414.

The TSVs 412, 414 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package. The solder balls 408 may form a part of the interface between the integrated memory assembly 306 and the memory controller 102.

Figure 4B:
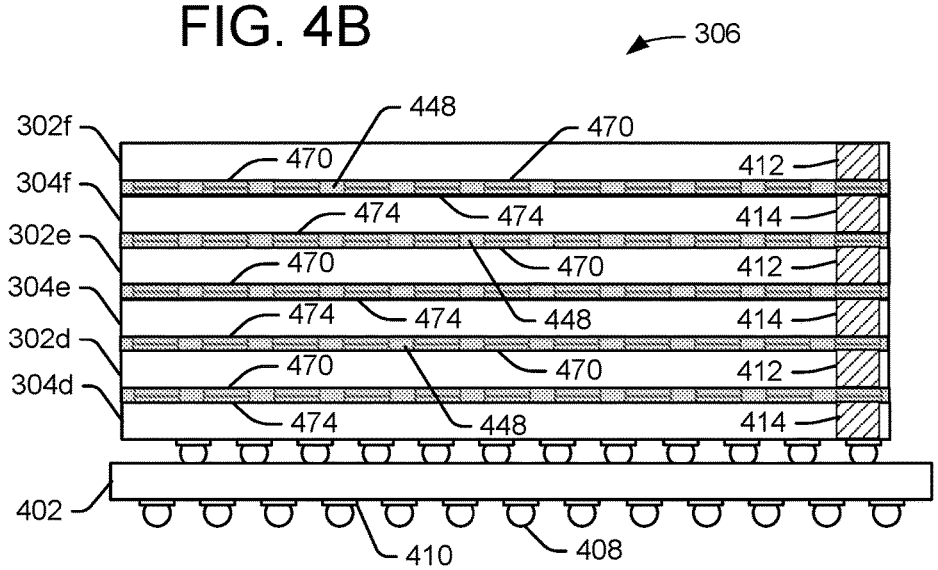
FIG. 4B depicts a side view of an embodiment of an integrated memory assembly stacked on a substrate.

FIG. 4B depicts a side view of an embodiment of an integrated memory assembly 306 stacked on a substrate 402. The integrated memory assembly 306 has three control die 304d, 304e, 304f and three memory structure die 302d, 302e, 302f. In some embodiments, there are many more than three memory structure die 302 and many more than three control die 304. In one embodiment, one of the control die (e.g., 302d) is a host control die. In this example, each control die 304 is bonded to at least one memory structure die 302. Optionally, a control die 304 may be bonded to two memory structure die 302. For example, control die 304e is bonded to both memory structure die 302d and 304e. Likewise, control die 304f is bonded to both memory structure die 302e and 304f.

Some of the bond pads 470, 474 are depicted. There may be many more bond pads. A space between two dies 302, 304 that are bonded together is filled with a solid layer 448, which may be formed from epoxy or other resin or polymer. In contrast to the example in FIG. 4A, the integrated memory assembly 306 in FIG. 4B does not have a stepped offset. A memory structure die through silicon via (TSV) 412 may be used to route signals through a memory structure die 302. A control die through silicon via (TSV) 414 may be used to route signals through a control die 304.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 5:
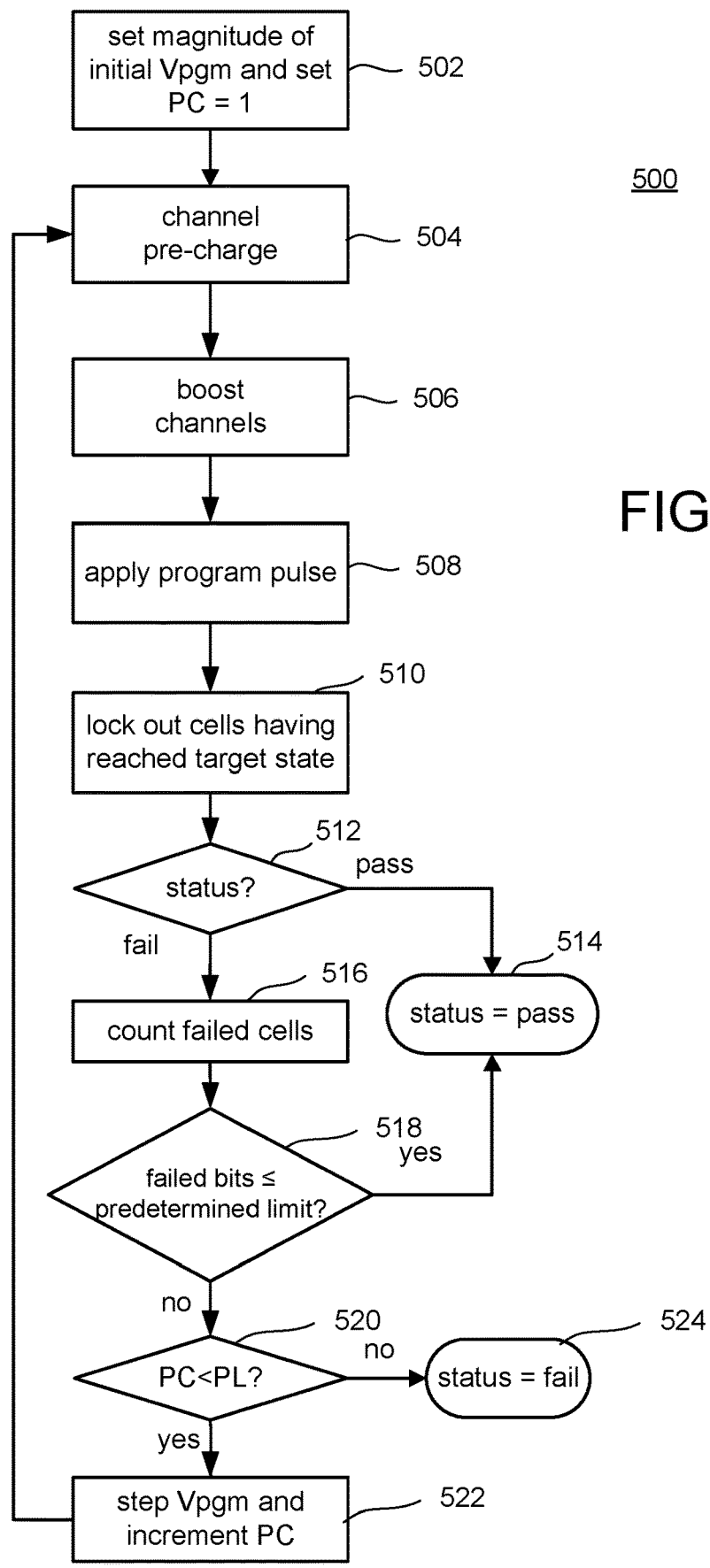
FIG. 5 is a flowchart describing one embodiment of a process for programming NAND strings of memory cells organized into an array.

FIG. 5 is a flowchart describing one embodiment of a process 500 for programming NAND strings of memory cells organized into an array. The process of FIG. 5 can be performed at the direction of state machine 312. In one example embodiment, the process of FIG. 5 is performed on memory die 300 using the control circuitry 310 (and read/write circuits 328, as well as decoders 332/324) discussed above. In one example embodiment, the process of FIG. 5 is performed on integrated memory assembly 306 using the control circuitry 310 discussed above. The process includes multiple loops, each of which includes a program phase (e.g., steps 504-508) and a verify phase (e.g., steps 510-518).

In many implementations, the magnitude of the program pulses is increased with each successive pulse by a predetermined step size. In step 502 of FIG. 5, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the memory system will pre-charge channels of NAND strings that include memory cells connected to the selected word line that are to be inhibited from programming.

In one embodiment, step 504 is the start of a program operation. In some embodiments, different sets of memory cells are programmed concurrently. For example, programming of memory cells in different memory structures 326 may be performed concurrently. In some embodiments, the start of concurrent program operations (e.g., step 504) is staggered such that step 504 occurs at different times for the different memory structures 326.

In step 506, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 508, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

In step 516, the memory system counts the number of memory cells that have not yet reached their respective target threshold voltage distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 5 is performed.

Figure 6A:
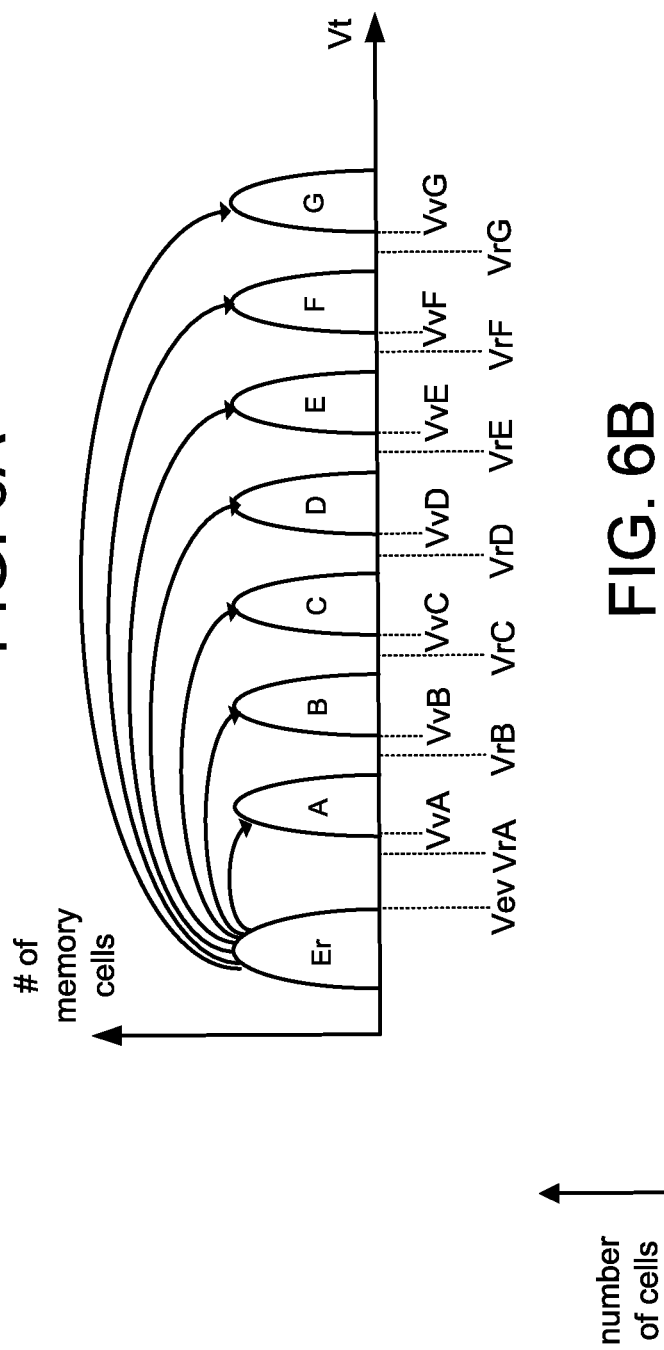
FIG. 6A illustrates example threshold voltage distributions for the memory array when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. FIG. 6A illustrates example threshold voltage distributions for the memory array when each memory cell stores three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 6A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 6A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 6A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 6A) or verify operation (e.g. see verify target levels VvA, VvB, VvC, VvD, VvE, VvF, and VvG of FIG. 6A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 6B:
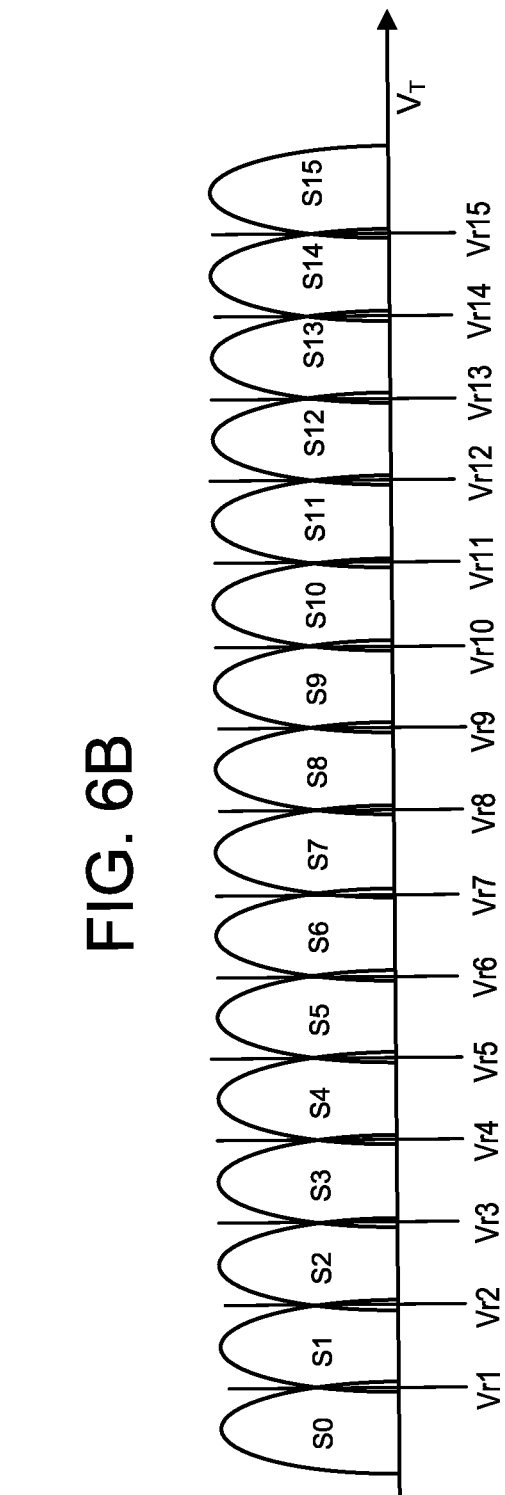
FIG. 6B depicts threshold voltage distributions in which each memory cell stores four bits of data.

FIG. 6B depicts threshold voltage distributions and one page mapping scheme when each memory cell stores four bits of data. FIG. 6B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible.

As noted, FIG. 6B depicts an example in which four bits are stored per memory cell. Thus, four pages may be stored in a set of memory cells. Fifteen read reference levels are depicted (Vr1-Vr15). The set of memory cells may be connected to the same word line.

Figure 8D:
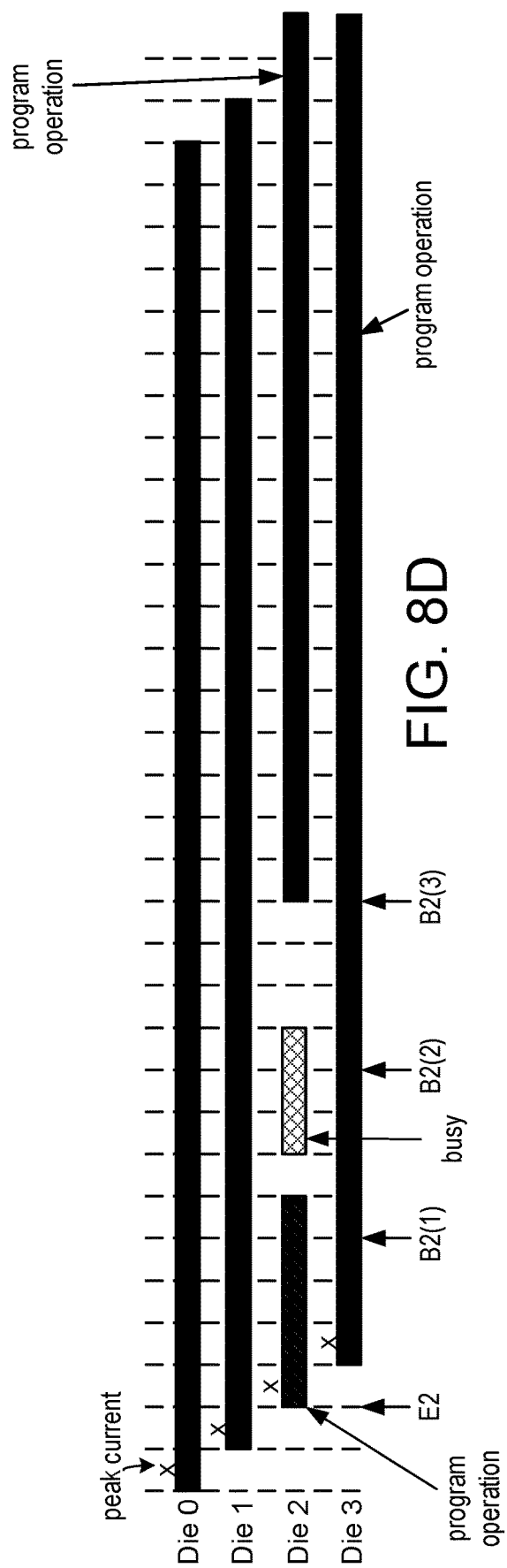

FIG. 7 is a flowchart of one embodiment of a process 700 of controlling current and/or power consumption in non-volatile storage. In one embodiment, process 700 is performed in memory system 100. Process 700 will be discussed with reference to FIGS. 8A-8D. FIGS. 8A-8D depict timing of embodiments of staggering concurrently performed program operations. FIGS. 8A-8D show timing of memory operations for four semiconductor dies. Each solid black bar represents a program operation that is being concurrently performed in the respective die. In some embodiments, each program operation has multiple program verify loops. For example, each program operation may perform steps 504-522 multiple times. FIG. 8B shows a bar having cross-hatched bars, which indicate when Die 2 is busy with a memory operation other than the program operation represented by the black bar. FIG. 8C shows a bar having cross-hatched bars for Die 1, which indicate when Die 1 is busy with a memory operation other than the program operation for Die 1 represented by the black bar. FIG. 8C shows a bar having cross-hatched bars for Die 2, which indicate when Die 2 is busy with a memory operation other than the program operation for Die 2 represented by the black bar. FIG. 8D shows an example in which Die 2 is not busy initially (as indicated by the first solid black bar). Then, Die 2 is temporarily busy with another operation, as indicated by the bar with the cross-hatches. Die 2 resumes the program operation again at B2(3), as indicated by the second black bar.

Step 702 includes the memory controller 102 issuing program commands to semiconductor dies. Hence, step 702 includes the semiconductor dies receiving the program commands. The program commands may be sent over communication channel 318. In one embodiment, memory controller 102 issues the program commands on an ONFI bus to the semiconductor dies. In one embodiment, the memory controller 102 issues the program commands to memory dies 300. In one embodiment, the memory controller 102 issues the program commands to control dies 304.

In step 704, the memory controller 102 issues a staggering command to at least one of the semiconductor dies. The staggering command may be sent over communication channel 318. In one embodiment, the staggering command is sent over an ONFI bus. In some embodiments, the staggering command is received at essentially the same time at each semiconductor die. For example, with reference to FIG. 2B, the staggering command may be sent from TM interface 228 over the bus 318. Each memory die 300 will this receive the staggering command at essentially the same time. Due to slight differences in the length of the bus 318 between the TM interface 228 and each memory die 300 there may be very slight differences in the time at which each memory die 300 receives the staggering command. In one embodiment, the reception of the staggering command at each semiconductor die serves as a synchronization event, by which it is meant that each semiconductor die is informed of a point in time that will serve as a common reference time for staggering the program commands. In other embodiments, a technique other than a staggering command is used as the synchronization event. For example, the memory controller 102 may send a signal over any control line on bus 318 to each of the memory die 300 to serve as the synchronization event.

In one embodiment, the semiconductor dies each have a clock 320 and a counter 322. In one embodiment, each semiconductor die resets its counter 322 in response to receiving the staggering command in order to synchronize the semiconductor dies to the synchronization event. This, in effect, synchronizes the counters 322 in each semiconductor die. Further details of a semiconductor die synchronizing its counter 322 to other semiconductor dies are discussed below in connection with FIG. 11.

In one embodiment, the staggering command is sent to each semiconductor die that will take part in staggering the start times of concurrent program operations. In one embodiment, the staggering command is sent to a host semiconductor die. The host semiconductor die may communicate with guest semiconductor dies to oversee the staggering of the start times of concurrent program operations. Further details of a host/guest embodiment are described below in connection with FIG. 13.

In step 706, each semiconductor die determines permitted start times for the program operation that it is to control. In one embodiment, the control circuitry 310 on the semiconductor die determines an earliest permitted start time and a number of permitted backup times. Note that the permitted backup start times could be to initiate the program command or to resume the program operation. Referring briefly to FIG. 8A, an earliest permitted start time and a number of permitted backup times are depicted for each semiconductor die. The earliest permitted start times are labeled E0, E1, E2, and E3. Die 0 has an earliest permitted start time of E0. Die 1 has an earliest permitted start time of E1. Die 2 has an earliest permitted start time of E2. Die 3 has an earliest permitted start time of E3. Each of the four semiconductor dies has a different earliest permitted start time. The dashed lines represent gaps in times (or delays) between each permitted start time. The space between each dashed line represents one unit of time. The unit of time is the same between each dashed line. The earliest permitted start times (E0-E3) are separated by the same unit of time, and follow one another. The permitted backup start times are labeled B0, B1, B2, and B3. Die 0 has permitted backup times at each occurrence of B0. Die 1 has permitted backup times at each occurrence of B1. Die 2 has permitted backup times at each occurrence of B2. Die 3 has permitted backup times at each occurrence of B3. There could be more occurrences of the permitted backup times than depicted in FIG. 8A. The permitted backup times all occur at different times, and are separated by the same unit of time as the earliest permitted start times. For a given die, the permitted backup times occur once every four units of time, in this example.

Steps 707-714 are performed independently at each semiconductor die. Step 707 is a determination of whether a program operation of a group of non-volatile memory cells is to be started. Note that in some cases a program operation of a group of memory cells is suspended to perform another operation, such as a read. In such a case, when the program operation is resumed, this is considered starting the program operation Step 708 includes the respective semiconductor die determining whether it is busy during a permitted start time. An example will be discussed with respect to semiconductor die 2 in FIGS. 8A-8D. In FIG. 8A, semiconductor die 2 is not busy at its earliest permitted time E2 to initiate a program operation. Hence, for this example, semiconductor die 2 will initiate the program operation at time E2. With respect to the process 700 in FIG. 7, the program operation is initiated in step 710. In one embodiment, the non-volatile memory cells that are programmed by a control circuit reside on the same semiconductor die on which the control circuit resides. For example, control circuitry 310, decoders 324/332 and read write circuits 328 may program non-volatile memory cells in memory structure 326 of the memory die 300. In one embodiment, the non-volatile memory cells that are programmed by a control circuit reside on a different semiconductor die than the semiconductor die on which the control circuit resides. For example, control circuitry 310 on the control die 304 may program non-volatile memory cells in memory structure 326 of the memory structure die 302.

In FIG. 8B, semiconductor die 2 is busy at its earliest permitted time E2 to initiate a program operation. Hence, semiconductor die 2 will not initiate the program operation at time E2. Semiconductor die 2 may be busy with another memory operation. In one embodiment, the other memory operation is a read operation. However, the other memory operation is not limited to being a read operation. With reference to FIG. 3A, semiconductor die 2 is memory die 300, which may be busy with another memory operation being performed in memory structure 326 under control of the state machine 312. With reference to FIG. 3B, semiconductor die 2 is control die 304, which may be busy with another memory operation being performed in memory structure 326 under control of the state machine 312 in the control die 304. With reference to FIG. 8B, semiconductor die 2 is not busy at the first of the permitted backup times B2(1). Hence, semiconductor die 2 will initiate the program operation at permitted backup time B2(1).

In FIG. 8C, semiconductor die 2 is busy at its earliest permitted time E2 to initiate a program operation. Hence, semiconductor die 2 will not initiate the program operation at time E2. Semiconductor die 2 is also busy at the first of the permitted backup times B2(1). Hence, semiconductor die 2 will not initiate the program operation at permitted backup times B2(1). Semiconductor die 2 is also busy at the second of the permitted backup times B2(2). Hence, semiconductor die 2 will not initiate the program operation at permitted backup times B2(2). Semiconductor die 2 is not busy at the third of the permitted backup times B2(3). Hence, semiconductor die 2 will initiate the program operation at permitted backup time B2(3). In the examples of FIGS. 8B and 8C, semiconductor die 2 initiates the program operation at the earliest permitted backup time in which it is no longer busy with another memory operation.

In FIG. 8D, semiconductor die 2 is not busy at its earliest permitted time E2 to initiate a program operation. Hence, semiconductor die 2 will initiate the program operation at time E2. However, semiconductor die 2 later becomes busy. This may be due to a request to read some other memory cells on semiconductor die 2. The cross-hatched bar indicates that die 2 is busy at time B2(2). Hence, die 2 waits until B2(3) to resume the program operation. Thus, note that similar to the examples in FIGS. 8B and 8C, die 2 is restricted as to when the program operation can again the started (otherwise referred to as resumed).

Referring again to the process 700 in FIG. 7, if the semiconductor die is busy at the permitted time (step 708 is busy), then the semiconductor die waits (in step 712) until the semiconductor die is no longer busy with another memory operation. After the semiconductor die is no longer busy with another memory operation, the program operation is initiated/resumed in step 714. In one embodiment, the program operation is initiated/resumed at the earliest permitted time after the semiconductor die is no longer busy with the memory operation that was being performed at the earliest permitted start time.

Staggering the start times of concurrently performed program operations may substantially reduce the probability that peak current usage occurs at the same time for different program operations. For example, with reference to FIG. 8A, peak current usage may occur relatively soon after the program operation is initiated. Thus, for die 0, there may be a peak current usage somewhere between E0 and E1, as indicted by the x above black bar for the program operation. For die 1, there may be a peak current usage somewhere between E1 and E2, as indicted by the x above black bar for the program operation. For die 2, there may be a peak current usage somewhere between E2 and E3, as indicted by the x above black bar for the program operation. For die 3, there may be a peak current usage somewhere between E3 and B0, as indicted by the x above black bar for the program operation.

Each of the program operations may have multiple program loops, with a peak current usage during each program loop. Thus, there may be other peak current usages at other times for each program operation in FIG. 8A. However, such peak current usages for other program loops are not depicted in FIG. 8A.

In some embodiments, if a die is busy at its earliest permitted start time, the program operation is initiated at a permitted backup time. FIG. 8B shows an example of how starting the program operation for die 2 at B2(1) may avoid having peak current usage align with that of other dies. For example, there may be a peak current usage for die 2 just after B2(1), as indicated by the x on the black bar for the program operation for die 2. Note that this does not align with the peak usages for program operations for other dies.

In some cases, multiple dies may be busy during their earliest permitted start times. FIG. 8C depicts an example in which both die 1 and die 2 are busy at their respective earliest permitted start times. In this example, programming is initiated for die 1 at permitted backup time B1(3), whereas programming is started for die 2 at permitted backup time B2(3). In each case, there is a peak of current usage just after programming is started (as indicted by the x on each black bar). However, because of the limitations placed on the permitted backup times for the two dies, the peak current usages for these two dies do not align.

In general, a set of one or more semiconductor dies have an earliest permitted start time for a program operation and a set of permitted backup times for the for program operation. In the examples of FIGS. 8A-8D, there is one semiconductor die in each set. In another embodiment, there are two semiconductor dies in each set. FIG. 9 depicts timing of staggered program operations, which are concurrently performed by four sets of semiconductor dies. One set contains dies 0 and 1, another set contains dies 2 and 3, another set includes dies 4 and 5, and still another set includes dies 6 and 7.

The earliest permitted start times are labeled E0, E1, E2, and E3. The set having die 0 and die 1 has an earliest permitted start time of E0. The set having die 2 and die 3 has an earliest permitted start time of E1. The set having die 4 and die 5 has an earliest permitted start time of E2. The set having die 6 and die 7 has an earliest permitted start time of E3. Each of the four sets of semiconductor dies has a different earliest permitted start time. The dashed lines represent gaps in times (or delays) between each permitted start time. The space between each dashed line represents one unit of time. The unit of time is the same between each dashed line. The earliest permitted start times (E0-E3) are separated by the same unit of time, and follow one another. The permitted backup start times are labeled B0, B1, B2, and B3. The set having die 0 and die 1 has permitted backup times at each occurrence of B0. The set having die 2 and die 3 has permitted backup times at each occurrence of B1. The set having die 4 and die 5 has permitted backup times at each occurrence of B2. The set having die 6 and die 7 has permitted backup times at each occurrence of B3. The permitted backup times all occur at different times, and are separated by the same unit of time as the earliest permitted start times. For a given die, the permitted backup times occur once every four units of time, in this example. In FIG. 9, die 3 is busy at its earliest permitted start time E1, as well as its first permitted backup time B1. Thus, the program operation is initiated for die 3 at the second occurrence of permitted backup time B1.

FIG. 10 depicts timing of staggered program operations, which are concurrently performed by two sets of semiconductor dies. One set contains dies 0, 1, 2, and 3; another set includes dies 4, 5, 6, and 7. The earliest permitted start times are labeled E0 and E1. The set having dies 0, 1, 2, and 3 has an earliest permitted start time of E0. The set having dies 4, 5, 6, and 7 has an earliest permitted start time of E1. The two sets of semiconductor dies have different earliest permitted start times. The dashed lines represent gaps in times (or delays) between each permitted start time. The space between each dashed line represents one unit of time. The unit of time is the same between each dashed line. The earliest permitted start times (E0, E1) are separated by the same unit of time, and follow one another. The permitted backup start times are labeled B0 and B1. The set having die 0, 1, 2, and 3 has permitted backup times at each occurrence of B0. The set having die 4, 5, 6, and 7 has permitted backup times at each occurrence of B1. The permitted backup times all occur at different times, and are separated by the same unit of time as the earliest permitted start times. For a given die, the permitted backup times occur once every two units of time, in this example. In FIG. 10, die 5 is busy at its earliest permitted start time E1, as well as its first, second, and third occurrences of permitted backup time B1. Thus, the program operation is initiated for die 5 at the fourth occurrence of permitted backup time B1.

Figure 11:
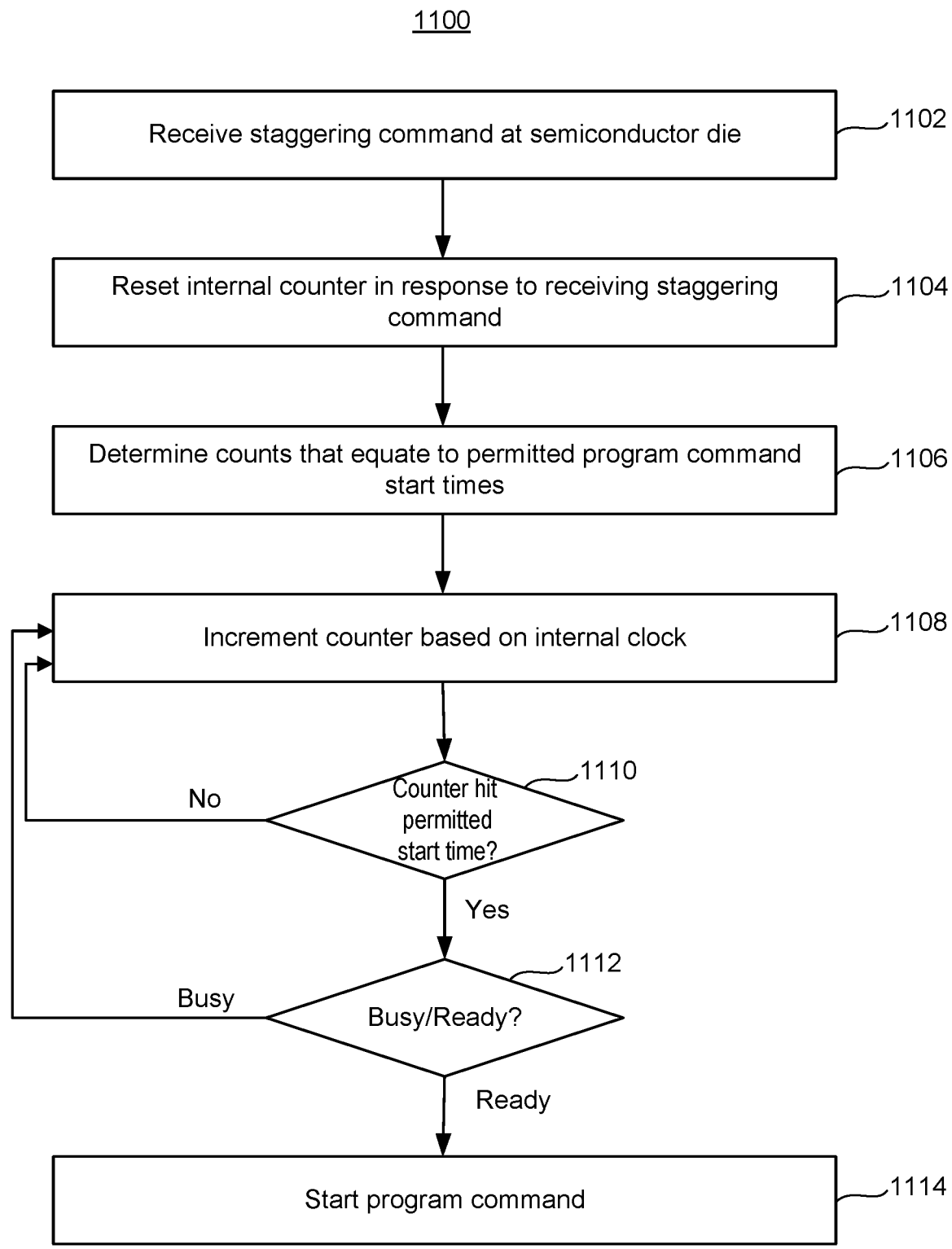
FIG. 11 is a flowchart of one embodiment of a process of a semiconductor die regulating the start time of a program operation.

As noted above, a semiconductor die may perform actions to stagger a program operation that it controls with program operations controlled by other semiconductor dies. FIG. 11 is a flowchart of one embodiment of a process 1100 of a semiconductor die regulating the start time of a program operation. In one embodiment, process 1100 is performed by memory die 300. In one embodiment, process 1100 is performed by control die 304. In an embodiment, process 1100 is perform concurrently in multiple semiconductor dies, which are staggering the start times of concurrent program operations.

Step 1102 includes the semiconductor die receiving a staggering command. In one embodiment, the staggering command is provided by the memory controller 102. The staggering command may be sent over communication channel 318. In one embodiment, the staggering command is sent over an ONFI bus. Note that other semiconductor dies may also receiving the staggering command at essentially the same time, as described above in the discussion of step 704.

Step 1104 includes the semiconductor die resetting an internal counter 322 in response to receiving the staggering command. Note that the other semiconductor dies may also reset their counters 322 in response to receiving the staggering command. Hence, this may result in synchronization of the counters 322 on the different semiconductor dies that are to stagger the concurrent program operations.

Figure 12A:
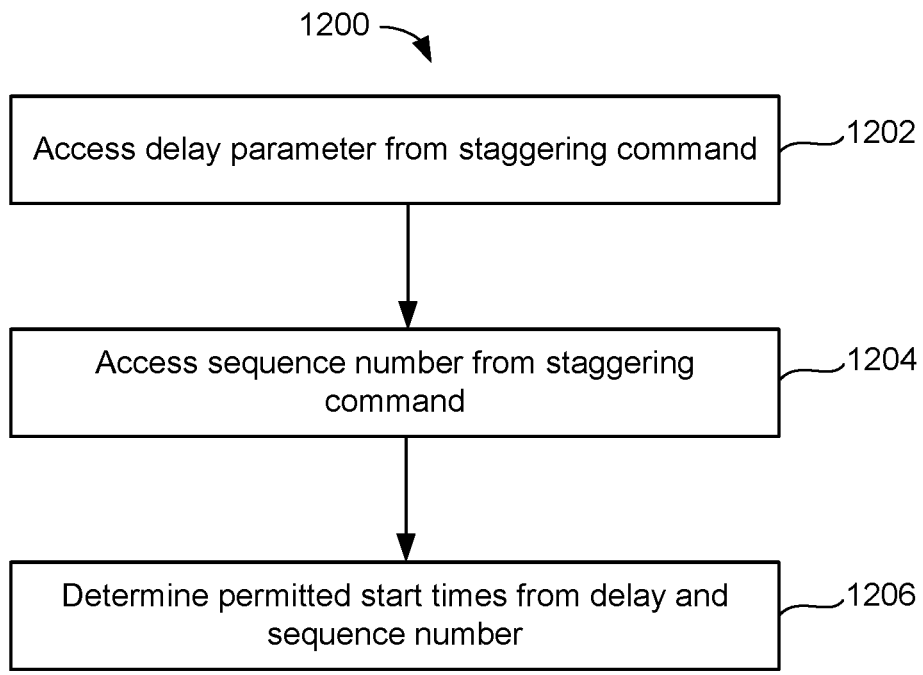
FIGS. 12A and 12B depict further details of a semiconductor die determining the earliest permitted start time and the permitted backup times.
Figure 12B:
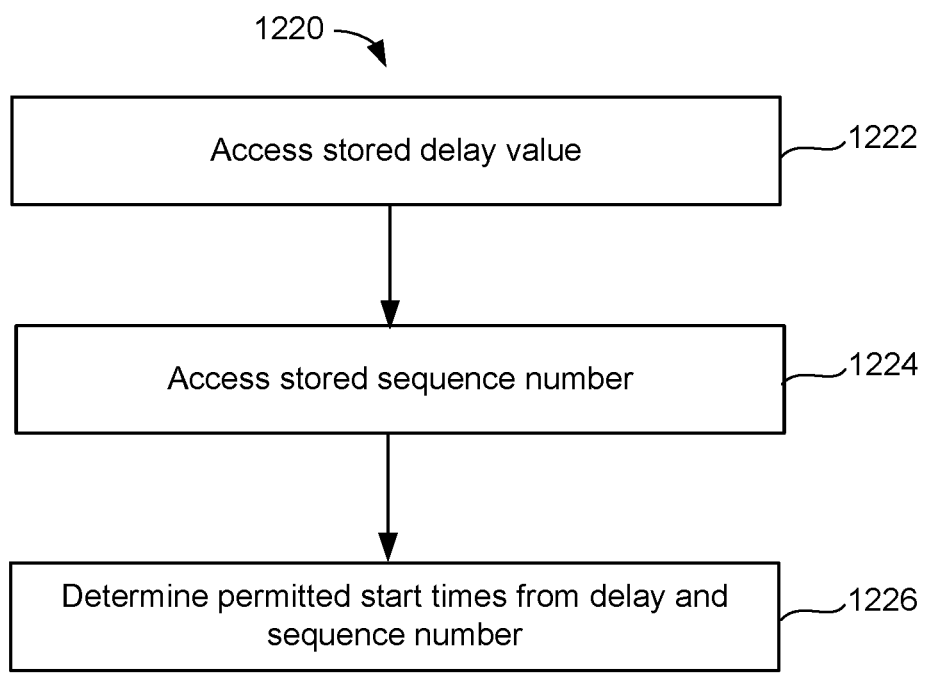

Step 1106 includes the semiconductor die determining counts (of the counter) that equate to the earliest permitted start time and the permitted backup times. In some embodiments, the semiconductor die determines the permitted start time and the permitted backup times based on information provided in the staggering command. In some embodiments, the semiconductor die determines the permitted start time and the permitted backup times based on stored information. In one embodiment, the information is stored on the memory die 300. In one embodiment, the information is stored in a memory structure die 302. FIGS. 12A and 12B depict further details of a semiconductor die determining the earliest permitted start time and the permitted backup times.

Step 1108 includes incrementing the counter 322 based on the internal clock 320. For example, with each cycle of the internal clock 320 the counter 322 is incremented by one. Note that it is not required for the internal clocks 320 of each semiconductor die to be synchronized. That is, it is not required that the rising edge and the falling edge of the clocks 320 occur at the same time. This may result in some small time differences between the semiconductor dies when the counters 322 are incremented. However, in some embodiments, such small time differences are tolerable. Note that by not having to synchronize the internal clocks 320, operation is simplified Step 1110 includes a determination of whether the counter 322 hits a target value that indicates a permitted start time for a program operation. The permitted start time could be the earliest permitted start time or any of the permitted backup times. If a permitted start time has not been hit, then control passes back to step 1106 to increment the counter 322 in response to the next clock cycle.

The semiconductor die could be performing another memory operation as it waits for the counter to hit a permitted start time, but that may not always be the case. When a permitted start time occurs, step 1112 includes a check to determine whether the semiconductor die is ready or busy. Here, ready/busy refers to whether or not the semiconductor die is controlled a memory operation in memory structure 326 other than the program operation that is the subject of the staggering. Note that this check is performed by the semiconductor die itself. Hence, there is no need for the memory controller 102 or some other entity to perform ready/busy polling of the semiconductor die. Therefore, operation is substantially simplified over techniques that perform ready/busy polling. If the semiconductor die is busy, then control passes back to step 1108 to again increment the counter 322 in response to the internal clock 320. Steps 1108-1112 are performed until it is determined in step 1112 that the semiconductor die is no longer busy. Thus, when the semiconductor die is no longer busy with the other memory operation, the program operation is started in step 1114. In one embodiment, starting of the program operation occurs at step 504 of process 500. Note that the program operation will be started at either the earliest permitted start time or one of the permitted backup times.

In one embodiment, a control circuit on the semiconductor die (e.g., memory die 300, control die 304) determines permitted start times for starting a program operation based on information provided in a staggering command. The staggering command may be provided by the memory controller 102. FIG. 12A is a flowchart of one embodiment of a process 1200 of determining permitted start times for starting a program operation, based on information provided in a staggering command. Process 1200 may be used in step 1106 of process 1100. Process 1200 describes actions of one of the semiconductor dies.

Step 1202 includes the semiconductor die accessing a delay parameter from the staggering command. In one embodiment, the delay parameter indicates the time gap between permitted start times. With reference to FIGS. 8A-8D, 9, and 10, the delay time refers to the time gap between the dashed vertical lines. Note that the time gap between the dashed vertical lines in a given one of FIGS. 8A-8D 9, and 10 is uniform. That is, that the time gap between each dashed vertical lines in a given diagram is the same.

Step 1204 includes the semiconductor die accessing a sequence number from the staggering command. The sequence number indicates a sequence for the semiconductor dies. In one embodiment, the sequence numbers are consecutive increasing integers starting at zero. In some embodiments, each semiconductor die has a logical unit number (LUN), which is fixed and pre-assigned. The LUN may be used for addressing purposes. The staggering command may specify a sequence number for each LUN. As a simple example, LUN 0 may be provided sequence number 0, LUN 1 may be provided sequence number 1, etc. However, many other options are possible. The sequence numbers could be used to indicate how sets of the semiconductor dies are formed by assigning the same sequence number to, for example, pairs of the semiconductor dies. For example, LUN 0 and LUN 1 may each be assigned the sequence number 0, LUN 2 and LUN 3 may each be assigned the sequence number 1, etc. The sequence numbers could be used to clearly indicate which of the semiconductor dies are to stagger the program operations.

Step 1206 includes the semiconductor die determining permitted start times from the delay parameter and the sequence number. The permitted start times include an earliest permitted start time and a set of one or more permitted backup start times. The earliest permitted delay time may be calculated by multiplying the sequence number by the delay parameter. For example, with respect to FIG. 8A, die 0 may have a sequence number of 0, die 1 may have a sequence number of 1, etc. The delay parameter may indicate the delay time that is depicted between E2 and E3. The earliest permitted start time for die 0 may be calculated as 0*delay time; the earliest permitted start time for die 1 may be calculated as 1*delay time; the earliest permitted start time for die 2 may be calculated as 2*delay time; and the earliest permitted start time for die 3 may be calculated as 3*delay time.

The first permitted backup start time may be calculated by adding time to the earliest permitted start times. For example, in FIG. 8A adding four delay times to the earliest permitted start time may be used to calculate the first permitted backup time. Later permitted backup start time may be calculated by adding four delay times to the previous permitted backup start time. Note that four delay times are used in this example because there are four different dies whose program operations are being staggered.

In one embodiment, the semiconductor die determines the permitted start times based on stored information. In one embodiment, the structure parameter storage 326a in the memory structure 326 is used to store parameters to be used for operating that memory structure 326. Those parameters may be loaded to parameter storage 334 upon power on.

FIG. 12B is a flowchart of one embodiment of a process 1220 of determining permitted start times for starting a program operation, based on stored information. Process 1220 may be used in step 1106 of process 1100. Process 1220 describes actions of one of the semiconductor dies.

Step 1222 includes the semiconductor die accessing a stored delay parameter. In one embodiment, the delay parameter is accessed from parameter storage 334 on the memory die 300. In one embodiment, the delay parameter is accessed from parameter storage 334 on the control die 304. Optionally, the delay parameter could be accessed from structure parameter storage 326a (on memory die 300 or control die 304). In one embodiment, the delay parameter indicates the time gap between permitted start times. With reference to FIGS. 8A-8D, 9, and 10, the delay time refers to the time gap between the dashed vertical lines.

Step 1224 includes the semiconductor die accessing a stored sequence number. The sequence number indicates a sequence for the semiconductor dies. In one embodiment, the sequence numbers are consecutive increasing integers starting at zero. In some embodiments, each semiconductor die has a logical unit number (LUN), which is fixed and pre-assigned. The LUN may be used for addressing purposes. In one embodiment, the sequence number is equal to the LUN. In one embodiment, the sequence number is based on the LUN. For example, there are two dies in a set as in FIG. 9, the dies having LUN 0 and 1 might be assigned sequence number 0, dies having LUN 2 and 3 might be assigned sequence number 1, etc. Thus, the sequence numbers could be used to indicate the sets of the semiconductor dies.

Step 1226 includes the semiconductor die determining possible start times from the delay parameter and the sequence number. The permitted start times include an earliest permitted start time and a set of one or more permitted backup start times. This calculation may be performed as described in step 1206 of FIG. 12A.

Many variations of process 1200 and 1220 are possible. In one embodiment, the delay parameter is obtained from the staggering command (as in step 1202), but the sequence number is obtained from storage (as in step 1224). In one embodiment, the delay parameter is obtained from storage (as in step 1222), but the sequence number is obtained from the staggering command (as in step 1204).

Figure 13:
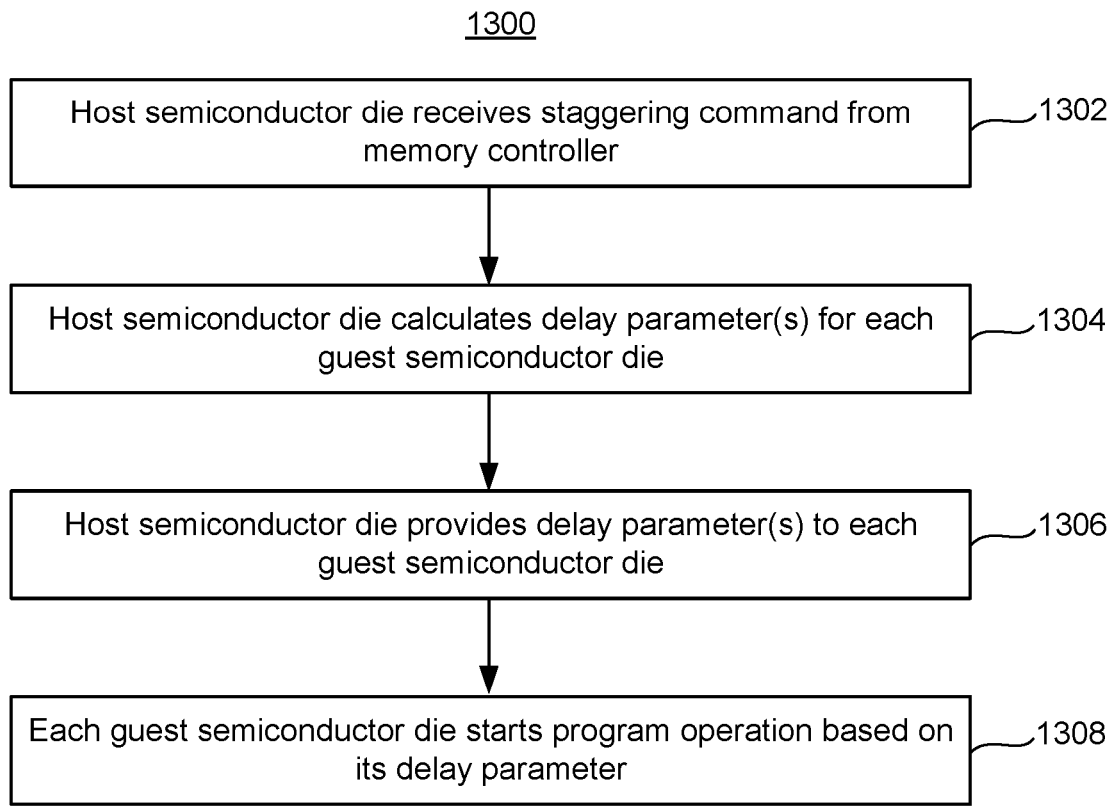
FIG. 13 is a flowchart of one embodiment of a process in which a host semiconductor die and guest semiconductor dies stagger the start of concurrently performed program operations.

In one embodiment, one of the semiconductor dies that staggers the program operations is a host and the rest are guests. FIG. 13 is a flowchart of one embodiment of a process 1300 in which a host semiconductor die and guest semiconductor dies stagger the start of concurrently performed program operations. The process 1300 may be used to reduce peak current and/or power in a memory system 100.

Step 1302 includes a host semiconductor die receiving a staggering command from the memory controller 102. The staggering command may be sent over communication channel 318. In one embodiment, the staggering command is sent over an ONFI bus. The staggering command indicates that the host semiconductor die and the guest semiconductor dies are to stagger the start of concurrently performed program operations.

Step 1304 includes the host semiconductor die calculating one or more delay parameters for each of the guest semiconductor dies. In one embodiment, the one or more delay parameters for a particular guest indicate the earliest permitted start time for the guest. The one or more delay parameters may also indicate the time gap between the earliest permitted start time and the first back up time. In one embodiment, a delay parameter is define in terms of clock cycles of the internal clock 320. For example, the delay parameter for one guest may be x clock cycles, for another guest may be 2*x clock cycles, for still another 3*x clock cycles, etc.

Step 1306 includes the host semiconductor die sending the one or more delay parameters to the guest semiconductor dies. In one embodiment, these one or more delay parameters are sent as a digital value that indicates the aforementioned number of clock cycles. In another embodiment, each guest semiconductor die stores table having a number of delay times, and the host semiconductor die sends a value that informs the guest which table value to use.

Step 1308 includes each guest semiconductor die starting the program operation based on its one or more delay parameters. In one embodiment, each guest semiconductor die may perform steps 708-714 of process 700 in step 1308. In one embodiment, each guest semiconductor die may perform steps 1104-1114 of process 1100 in step 1308.

Figure 14:
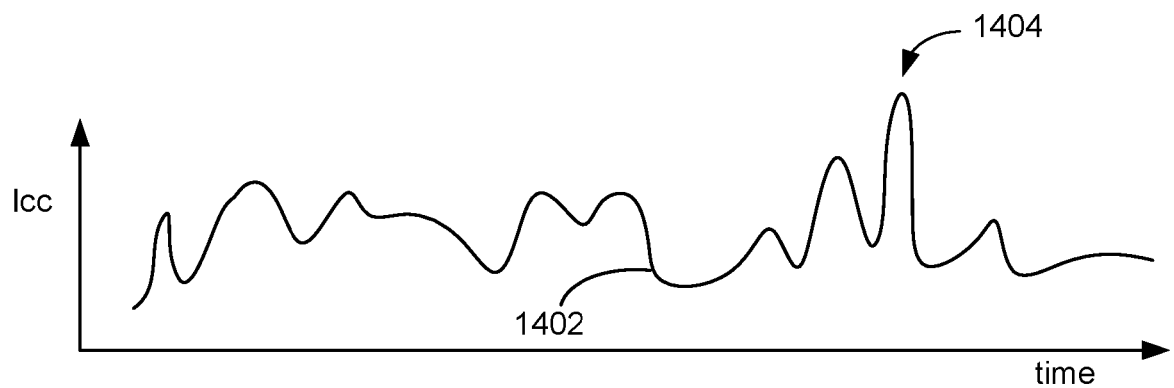
FIG. 14 is a plot that depicts an example plot of current (Icc) usage versus time for one loop of a program operation.

FIG. 14 is a plot that depicts an example plot 1402 of current (Icc) usage versus time for one loop of a program operation. In one embodiment, the program loop contains one iteration of process 500 (steps 504-522). Note that the program operations in FIGS. 8A-8C, 9, and 10 may contain numerous such program loops. The plot 1402 has a peak 1404 of current usage. Embodiments of staggered initiation of concurrent programming, reduce or eliminate the probability that such peaks 1404 occur at the same time for different sets of semiconductor dies.

Figure 15:
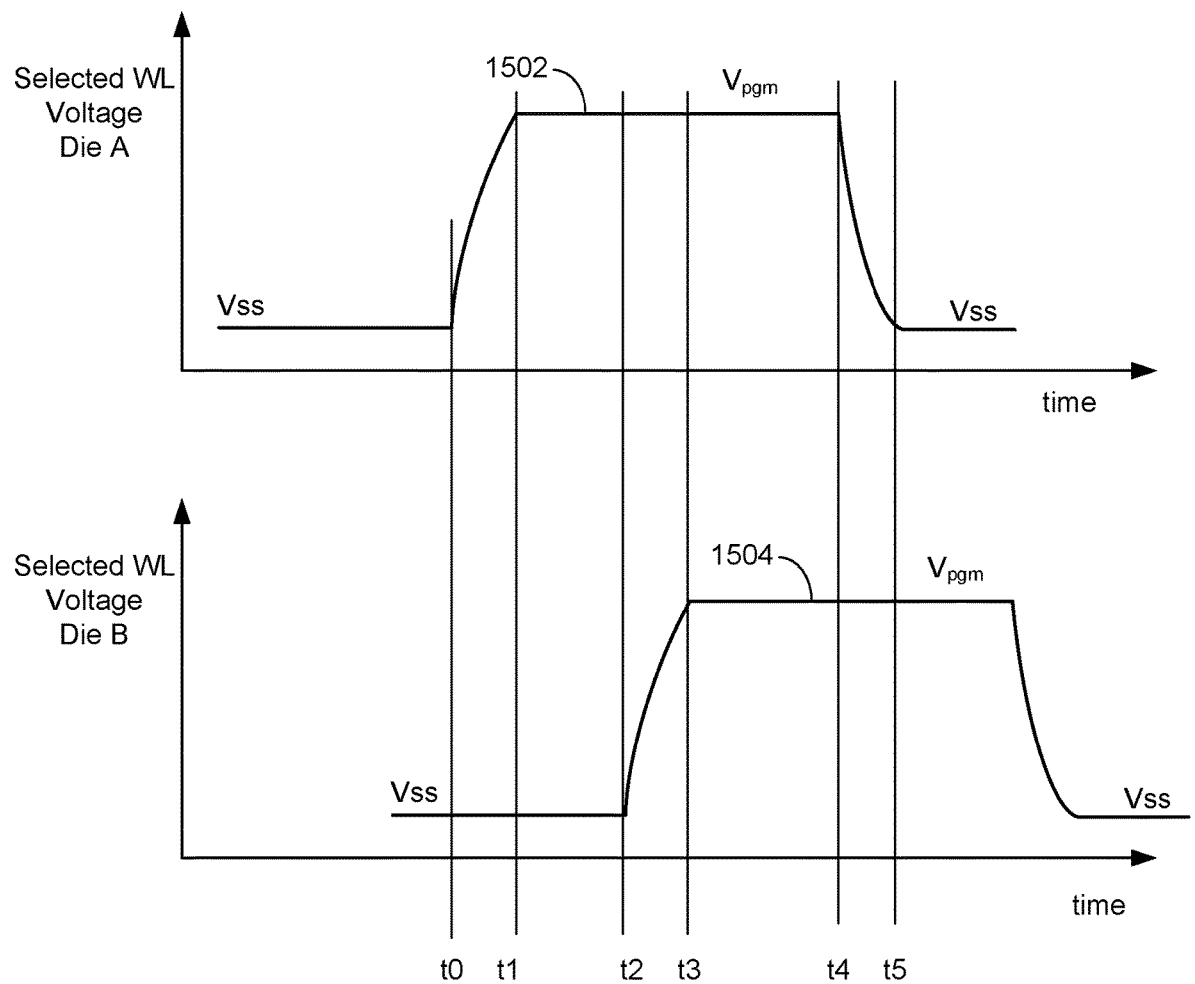
FIG. 15 depicts timing of a program voltage applied to a selected word line in two different dies.

FIG. 15 depicts timing of a program voltage applied to a selected word line in two different dies. The selected word line is connected to memory cells that are being programmed in memory structure 326. Plot 1502 is the voltage applied to the selected word line in memory structure 326 of Die A. Plot 1504 is the voltage applied to the selected word line in memory structure 326 of Die B. The plots 1502, 1504 show one embodiment of staggering program operations.

Plot 1502 shows that at t0 the voltage on the selected word line in Die A starts to increase from a steady state voltage (Vss) towards a program voltage (Vpgm). By t1, the voltage on the selected word line in Die A has reached the program voltage. Plot 1504 shows that at t2 the voltage on the selected word line in Die B starts to increase from the steady state voltage (Vss) towards the program voltage (Vpgm). By t3, the voltage on the selected word line in Die B has reached the program voltage. At t4 the voltage on the selected word line in Die A starts to reduce from Vpgm to Vss, which is reached at t5.

Thus, the program voltage is delayed in Die B, relative to the program voltage in Die A, by the t2-t0. In some embodiments, this delay is quite short. For example, the program voltage may be initiated in Die B (at t2) while the program voltage is still being applied to the selected word line in Die A (between t1 to t4). In some embodiments, these relatively short delays in staggering times are very beneficial in reducing peak current and/or power consumption in the memory system 100.

In some embodiments, the use of the counter 322 to monitor for permitted start times for the program operations helps to achieve this fine granularity in delays in staggering times. The internal clock 320 has a high enough frequency such that there are many clock cycles during each program/verify loop. Hence, the counter 322 may have a target value that can precisely target a point with the program/verify loop.

In view of the above, it can be seen that a first embodiment includes an apparatus comprising a plurality of sets of semiconductor dies. Each semiconductor die comprises a control circuit configured to be connected to non-volatile memory cells. Collectively the control circuits are configured to stagger start times of concurrently performed program operations of the non-volatile memory cells. Each set of semiconductor dies has a different set of permitted start times, including an earliest permitted start time and a plurality of permitted backup start times. The earliest permitted start times are each separated by a unit of time. Each respective control circuit is configured to delay the start time of a program operation from a permitted start time for the set of semiconductor dies in which the respective control circuit resides by n*m units of time if the respective control circuit is controlling a different memory operation at the permitted start time for the set of semiconductor dies, wherein n is how many sets of semiconductor dies are concurrently performing the program operations, wherein m is an integer.

In a second embodiment, and in furtherance of the first embodiment, the n*m units of time is the earliest time after the respective control circuit is no longer controlling the different memory operation.

In a third embodiment, and in furtherance of the first or second embodiments, a first semiconductor die of the plurality of semiconductor dies is a host. All remaining semiconductor dies of the plurality of semiconductor dies are guests. The host semiconductor die is configured to instruct each respective guest semiconductor die as to the earliest permitted start time for the program operation for the respective guest semiconductor die.

In a fourth embodiment, and in furtherance of the third embodiment, the control circuit of each respective guest semiconductor die is configured to resume the program operation for the guest n*m units of time after the earliest permitted time if the guest is busy with another memory operation anytime at or after the earliest permitted start time. The n*m units of time for the guest is the earliest time after the respective guest semiconductor is no busy with the other memory operation.

In a fifth embodiment, and in furtherance of any of the first to fourth embodiments, the apparatus further comprises a memory controller in communication with the plurality of sets of semiconductor dies. The memory controller is configured to instruct each respective semiconductor die as to the earliest permitted time to start the program operation for the respective semiconductor die. The earliest permitted times are staggered by the unit of time.

In a sixth embodiment, and in furtherance of any of the first to fifth embodiments, the apparatus further comprises a memory controller in communication with the plurality of sets of semiconductor dies. The memory controller is configured to send a staggering command to the plurality of sets of semiconductor dies. The staggering command indicates the earliest permitted start time for each set of semiconductor dies In a seventh embodiment, and in furtherance of the sixth embodiment, the staggering command comprises a delay parameter. The control circuit each respective semiconductor die is each configured to determine the earliest permitted start time for the respective semiconductor die based on the delay parameter. The control circuit each respective semiconductor die is each configured to determine the plurality of permitted backup start times for the respective semiconductor die based on the delay parameter.

In an eighth embodiment, and in furtherance of the seventh embodiment, the delay parameter specifies the unit of time.

In a ninth embodiment, and in furtherance of the sixth embodiment, the staggering command specifies an order of the earliest permitted start times for each set of semiconductor dies. The control circuit of each respective semiconductor die is each configured to determine the earliest permitted start time for the respective semiconductor die based on the order. The control circuit of each respective semiconductor die is each configured to determine a plurality of back up start times for the respective semiconductor die based on the order.

In a tenth embodiment, and in furtherance of the sixth embodiment, each semiconductor die further comprises a counter and a clock. The control circuit of each semiconductor die is further configured to: reset the counter upon receiving the staggering command; increment the counter based on the clock; start the program operation for the respective semiconductor die if the respective semiconductor die is not busy when the counter hits a target value that represents the earliest permitted start time for the respective semiconductor die; and delay the start time of the program operation by n*m units of time if the respective semiconductor die is performing a different memory operation when the counter hits the target value.

In an eleventh embodiment, and in furtherance of any of the first to tenth embodiments, the order of the earliest permitted start times for the sets of semiconductor dies is fixed and pre-assigned.

In a twelfth embodiment, and in furtherance of any of the first to eleventh embodiments, each semiconductor die comprises the non-volatile memory cells to which the control circuit is connected.

In a thirteenth embodiment, and in furtherance of any of the first to twelfth embodiments, the non-volatile memory cells that are programmed by a given control circuit reside on a different semiconductor die than the semiconductor die on which the given control circuit resides. The semiconductor die on which the given control circuit resides is bonded to the semiconductor die on which the non-volatile memory cells that are programmed by the given control circuit reside.

One embodiment includes a method comprising receiving a staggering command from a memory controller at a plurality of semiconductor dies, the staggering command indicating that program operations of non-volatile memory cells are to be staggered and performed concurrently. The method comprises determining, at each semiconductor die, an earliest permitted start time initiate a program operation of the non-volatile memory cells and a plurality of permitted backup start times to initiate or resume the program operation by each respective semiconductor die based on the staggering command, wherein each permitted start time is different. The method comprises staggering initiation of the program operations of the non-volatile memory cells by the respective semiconductor dies. Staggering initiation of the program operations includes initiating the program operation by a respective semiconductor die at the earliest permitted start time for the respective semiconductor die if the respective semiconductor die is not busy with another memory operation at the earliest permitted start time. Staggering initiation of the program operations further includes initiating or resuming the program operation by the respective semiconductor die at the earliest permitted backup start time at which the respective semiconductor die is no longer busy with another memory operation if the respective semiconductor die is busy with another memory operation anytime at or after the earliest permitted time. The method also includes performing the staggered program operations concurrently.

One embodiment includes a non-volatile memory system, comprising a memory controller, and a plurality of memory dies in communication with the memory controller. The plurality of memory dies each comprise: a memory structure comprising non-volatile memory cells, and a control circuit in communication with the memory structure. The memory controller is configured to send a separate command to perform a program operation to each memory die of the plurality of memory dies. The memory controller is configured to send a staggering command to the plurality of memory dies. Each control circuit is configured to start the program operation for that memory die at a different time than other memory dies in response to the staggering command. The control circuits of the memory dies are configured to concurrently perform the program operations. The control circuit of each memory die is configured to monitor a plurality of permitted program start times that are defined by: (sequence number*delay time)+cycle time. Each memory die has a different sequence number in a set of consecutive increasing integers that start at zero. The cycle time is equal to the delay time times the number of memory dies that stagger the program operations. The control circuit of each memory die is configured to start the program operation for that memory die at the earliest permitted program start time when the control circuit is ready to program.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of sets of semiconductor dies, each semiconductor die comprising a control circuit configured to be connected to non-volatile memory cells;
wherein collectively the control circuits are configured to stagger start times of concurrently performed program operations of the non-volatile memory cells, each set of semiconductor dies having a different set of permitted start times, including an earliest permitted start time and a plurality of permitted backup start times, the permitted start times separated by a unit of time; and
wherein each respective control circuit is configured to delay the start time of a program operation from a permitted start time for the set of semiconductor dies in which the respective control circuit resides by n*m units of time if the respective control circuit is controlling a different memory operation at the permitted start time, wherein n is how many sets of semiconductor dies are concurrently performing the program operations, wherein m is an integer.

2. The apparatus of claim 1, wherein the n*m units of time is the earliest time after the respective control circuit is no longer controlling the different memory operation.

3. The apparatus of claim 1, wherein:
a first semiconductor die of the plurality of semiconductor dies is a host; and
all remaining semiconductor dies of the plurality of semiconductor dies are guests, wherein the host semiconductor die is configured to instruct each respective guest semiconductor die as to the earliest permitted start time for the program operation for the respective guest semiconductor die.

4. The apparatus of claim 3, wherein:
the control circuit of each respective guest semiconductor die is configured to resume the program operation for the guest n*m units of time after the earliest permitted time if the guest is busy with another memory operation anytime at or after the earliest permitted start time, wherein the n*m units of time for the guest is the earliest time after the respective guest semiconductor is no longer busy with the other memory operation.

5. The apparatus of claim 1, further comprising:
a memory controller in communication with the plurality of sets of semiconductor dies, wherein the memory controller is configured to instruct each respective semiconductor die as to the earliest permitted time to start the program operation for the respective semiconductor die, wherein the earliest permitted times are staggered by the unit of time.

6. The apparatus of claim 1, further comprising:
a memory controller in communication with the plurality of sets of semiconductor dies, wherein the memory controller is configured to send a staggering command to the plurality of sets of semiconductor dies, wherein the staggering command indicates the earliest permitted start time for each set of semiconductor dies.

7. The apparatus of claim 6, wherein:
the staggering command comprises a delay parameter; and
the control circuit of each respective semiconductor die is each configured to determine the earliest permitted start time for the respective semiconductor die based on the delay parameter; and
the control circuit of each respective semiconductor die is each configured to determine the plurality of permitted backup start times for the respective semiconductor die based on the delay parameter.

8. The apparatus of claim 7, wherein:
the delay parameter specifies the unit of time.

9. The apparatus of claim 6, wherein:
the staggering command specifies an order of the earliest permitted start times for each set of semiconductor dies;
the control circuit of each respective semiconductor die is each configured to determine the earliest permitted start time for the respective semiconductor die based on the order; and
the control circuit of each respective semiconductor die is each configured to determine the plurality of permitted backup start times for the respective semiconductor die based on the order.

10. The apparatus of claim 6, wherein:
each semiconductor die further comprises a counter and a clock;
the control circuit of each semiconductor die is further configured to:

reset the counter upon receiving the staggering command;

increment the counter based on the clock;

initiate the program operation for the respective semiconductor die if the respective semiconductor die is not busy when the counter hits a target value that represents the earliest permitted start time for the respective semiconductor die; and delay the start time of the program operation by n*m units of time if the respective semiconductor die is performing a different memory operation when the counter hits the target value.

11. The apparatus of claim 1, wherein the order of the earliest permitted start times for the sets of semiconductor dies is fixed and pre-assigned.

12. The apparatus of claim 1, wherein each semiconductor die comprises the non-volatile memory cells to which the control circuit is connected.

13. The apparatus of claim 1, wherein the non-volatile memory cells that are programmed by a given control circuit reside on a different semiconductor die than the semiconductor die on which the given control circuit resides, wherein the semiconductor die on which the given control circuit resides is bonded to the semiconductor die on which the non-volatile memory cells that are programmed by the given control circuit reside.

14. A method, comprising:

receiving a staggering command from a memory controller at a plurality of semiconductor dies, the staggering command indicating that program operations of non-volatile memory cells are to be staggered and performed concurrently;

determining, at each semiconductor die, an earliest permitted start time to initiate a program operation of the non-volatile memory cells and a plurality of permitted backup start times to initiate or resume the program operation by each respective semiconductor die based on the staggering command, wherein each permitted start time is different; and staggering initiation of the program operations of the non-volatile memory cells by the respective semiconductor dies, including:

initiating the program operation by a respective semiconductor die at the earliest permitted start time for the respective semiconductor die if the respective semiconductor die is not busy with another memory operation at the earliest permitted start time; and initiating or resuming the program operation by the respective semiconductor die at the earliest permitted backup start time at which the respective semiconductor die is no longer busy with another memory operation if the respective semiconductor die is busy with another memory operation anytime at or after the earliest permitted start time; and performing the staggered program operations concurrently.

15. The method of claim 14, wherein the staggering command comprises an order of the semiconductor dies and a delay parameter, wherein determining, at each semiconductor die, the earliest permitted start time and the plurality of permitted backup start times comprises:

determining the earliest permitted start time and the plurality of permitted backup start times based on the order of the semiconductor dies and the delay parameter.

16. A non-volatile memory system, comprising:

a memory controller; and a plurality of memory dies in communication with the memory controller, wherein the plurality of memory dies each comprise: a memory structure comprising non-volatile memory cells, and a control circuit in communication with the memory structure;

wherein the memory controller is configured to send a separate command to perform a program operation to each memory die of the plurality of memory dies, wherein the memory controller is configured to send a staggering command to the plurality of memory dies;

wherein each control circuit is configured to start the program operation for that memory die at a different time than other memory dies in response to the staggering command;

wherein the control circuits of the memory dies are configured to concurrently perform the program operations;

wherein the control circuit of each memory die is configured to monitor a plurality of permitted program start times that are defined by: (sequence number*delay time)+cycle time, wherein each memory die has a different sequence number in a set of consecutive increasing integers that start at zero, wherein the cycle time is equal to the delay time times the number of memory dies that stagger the program operations; and wherein the control circuit of each memory die is configured to start the program operation for that memory die at the earliest permitted program start time when the control circuit is ready to program.

17. The non-volatile memory system of claim 16, wherein the staggering command specifies the delay time.

18. The non-volatile memory system of claim 16, wherein the staggering command specifies the sequence number.

19. The non-volatile memory system of claim 16, wherein the sequence number for each memory die is pre-assigned and fixed.

20. The non-volatile memory system of claim 16, wherein:

each memory die further comprises a clock and a counter; and the control circuit of each memory die is further configured to reset the counter upon receiving the staggering command;

the control circuit of each memory die is further configured to increment the counter based on the clock; and the control circuit of each memory die is further configured to monitor the plurality of permitted program start times based on the counter.

* * * * *